(12) United States Patent
Meyer et al.

(10) Patent No.: US 11,719,634 B2
(45) Date of Patent: *Aug. 8, 2023

(54) HIGHLY STABLE SEMICONDUCTOR LASERS AND SENSORS FOR III-V AND SILICON PHOTONIC INTEGRATED CIRCUITS

(71) Applicant: The Government of the United States of America, as represented by the Secretary of the Navy, Arlington, VA (US)

(72) Inventors: Jerry R. Meyer, Catonsville, MD (US); Igor Vurgaftman, Severna Park, MD (US); Chadwick Lawrence Canedy, Washington, DC (US); William W. Bewley, Falls Church, VA (US); Chul Soo Kim, Springfield, VA (US); Charles D. Merritt, Fairfax, VA (US); Michael V. Warren, Arlington, VA (US); R. Joseph Weiblen, Washington, DC (US); Mijin Kim, Springfield, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 155 days.

This patent is subject to a terminal disclaimer.

(21) Appl. No.: 17/407,274

(22) Filed: Aug. 20, 2021

(65) Prior Publication Data
US 2021/0396670 A1    Dec. 23, 2021

Related U.S. Application Data

(63) Continuation of application No. 16/509,613, filed on Jul. 12, 2019, now Pat. No. 11,125,689.

(Continued)

(51) Int. Cl.
*G01N 21/59* (2006.01)
*H01S 5/028* (2006.01)
(Continued)

(52) U.S. Cl.
CPC ............ *G01N 21/59* (2013.01); *G01J 3/1895* (2013.01); *G01J 3/2803* (2013.01);
(Continued)

(58) Field of Classification Search
CPC ...... G01N 21/59; G01N 21/255; G01N 21/27; G01N 2201/0612; G01N 21/7746;
(Continued)

(56) References Cited

U.S. PATENT DOCUMENTS

| | | | |
|---|---|---|---|
| 3,902,133 A | 8/1975 | Watts | |
| 5,592,503 A * | 1/1997 | Welch | H01S 5/20 372/50.11 |

(Continued)

OTHER PUBLICATIONS

Extended European Search Report and Written Opinion dated Jun. 3, 2022 in corresponding European Patent Application No. 19833825.3.

(Continued)

*Primary Examiner* — Mohamed K Amara
(74) *Attorney, Agent, or Firm* — US Naval Research Laboratory; Joslyn Barritt

(57) ABSTRACT

Building blocks are provided for on-chip chemical sensors and other highly-compact photonic integrated circuits combining interband or quantum cascade lasers and detectors with passive waveguides and other components integrated on a III-V or silicon. A MWIR or LWIR laser source is evanescently coupled into a passive extended or resonant-cavity waveguide that provides evanescent coupling to a sample gas (or liquid) for spectroscopic chemical sensing. In the case of an ICL, the uppermost layer of this passive (Continued)

waveguide has a relatively high index of refraction that enables it to form the core of the waveguide, while the ambient air, consisting of the sample gas, functions as the top cladding layer. A fraction of the propagating light beam is absorbed by the sample gas if it contains a chemical species having a fingerprint absorption feature within the spectral linewidth of the laser emission.

2 Claims, 26 Drawing Sheets

Related U.S. Application Data

(60) Provisional application No. 62/697,419, filed on Jul. 13, 2018.

(51) Int. Cl.

| | |
|---|---|
| *H01S 5/10* | (2021.01) |
| *H01S 5/125* | (2006.01) |
| *H01S 5/34* | (2006.01) |
| *H01S 5/343* | (2006.01) |
| *H01S 5/042* | (2006.01) |
| *H01S 5/20* | (2006.01) |
| *H01S 5/02* | (2006.01) |
| *H01S 5/026* | (2006.01) |
| *G02B 6/10* | (2006.01) |
| *G01N 21/27* | (2006.01) |
| *G01N 21/25* | (2006.01) |
| *G01J 3/18* | (2006.01) |
| *G01J 3/28* | (2006.01) |
| *H01S 5/22* | (2006.01) |
| *H01S 5/06* | (2006.01) |
| *H01S 5/062* | (2006.01) |

(52) U.S. Cl.
CPC ........... *G01N 21/255* (2013.01); *G01N 21/27* (2013.01); *G02B 6/102* (2013.01); *H01S 5/0215* (2013.01); *H01S 5/0262* (2013.01); *H01S 5/0287* (2013.01); *H01S 5/0421* (2013.01); *H01S 5/101* (2013.01); *H01S 5/125* (2013.01); *H01S 5/2063* (2013.01); *H01S 5/2206* (2013.01); *H01S 5/3402* (2013.01); *H01S 5/343* (2013.01); *G01N 2201/0612* (2013.01); *H01S 5/062* (2013.01); *H01S 5/0612* (2013.01)

(58) Field of Classification Search
CPC .. G01N 21/7703; G01J 3/1895; G01J 3/2803; G01J 3/0205; G01J 3/0259; G01J 3/42; G01J 3/10; G02B 6/102; H01S 5/0215; H01S 5/0262; H01S 5/0287; H01S 5/0421; H01S 5/101; H01S 5/125; H01S 5/2063; H01S 5/2206; H01S 5/3402; H01S 5/343; H01S 5/0612; H01S 5/062; H01S 5/0028; H01S 5/021; H01S 5/026; H01S 5/1032; H01S 5/22; H01S 5/3422; H01S 5/1025; H01S 5/34306; H01S 5/4087; H01S 2301/17
See application file for complete search history.

(56) References Cited

U.S. PATENT DOCUMENTS

| | | | | |
|---|---|---|---|---|
| 6,381,380 B1* | 4/2002 | Forrest | ................... | B82Y 20/00 385/14 |
| 6,647,046 B1* | 11/2003 | Salvatore | ................ | H01S 5/028 372/98 |
| 7,042,631 B2* | 5/2006 | Smith | ................... | G02B 6/032 385/27 |
| 7,450,340 B2* | 11/2008 | Lee | ....................... | G11B 5/3163 |
| 8,611,756 B1* | 12/2013 | Wach | ....................... | G02B 6/43 398/140 |
| 8,717,417 B2 | 5/2014 | Sali et al. | | |
| 9,209,602 B2 | 12/2015 | Davies et al. | | |
| 9,601,901 B2 | 3/2017 | Caneau et al. | | |
| 9,612,398 B2 | 4/2017 | Vurgaftman et al. | | |
| 9,960,571 B2 | 5/2018 | Meyer et al. | | |
| 10,297,699 B2 | 5/2019 | Meyer et al. | | |
| 11,125,689 B2* | 9/2021 | Meyer | .................. | G01N 21/255 |
| 11,466,316 B2* | 10/2022 | Rothberg | .............. | H01S 3/1115 |
| 2010/0238962 A1 | 9/2010 | Oh et al. | | |
| 2014/0027708 A1 | 1/2014 | Goyal et al. | | |
| 2014/0161146 A1* | 6/2014 | Ben Bakir | ............ | H01S 5/1032 372/45.012 |
| 2015/0249318 A1* | 9/2015 | Fattal | ....................... | H01S 5/343 372/44.01 |
| 2016/0336708 A1 | 11/2016 | Liang | | |
| 2016/0359298 A1 | 12/2016 | Meyer et al. | | |
| 2017/0059477 A1* | 3/2017 | Feitisch | ................ | G01N 21/274 |
| 2017/0125979 A1 | 5/2017 | Yang et al. | | |
| 2017/0317471 A1 | 11/2017 | Lor et al. | | |
| 2017/0345958 A1 | 11/2017 | Meyer et al. | | |
| 2019/0273358 A1* | 9/2019 | Zhang | ..................... | H01S 5/026 |
| 2021/0367409 A1* | 11/2021 | Castiglia | ................. | H01S 5/042 |
| 2021/0389242 A1* | 12/2021 | Meyer | ................... | H01S 5/2206 |
| 2021/0396666 A1* | 12/2021 | Meyer | ..................... | G01N 21/27 |
| 2021/0396668 A1* | 12/2021 | Meyer | .................... | H01S 5/2063 |
| 2021/0396669 A1* | 12/2021 | Meyer | ................... | H01S 5/2206 |

OTHER PUBLICATIONS

B. Tromborg et al., "Stability Analysis for a Semiconductor Laser," IEEE J. Quant. Electron.20,1023 (1984).
V. Svedas, "The Significance of Lidar Pulse Stability in the IR Detection of Hazardous Compounds," IEEE Sensors Journal 14, 1391 (2014).
L. A. Sterczewski et al., "Multiheterodyne Spectroscopy Using Interband Cascade Lasers," Opt. Engr. 57, 011014 (2018).
S. Takeda and S. Nakagawa, "Feedback Tolerance of DFB Laser for Silicon Photonics Packaging," Opt. Expr. 22, 8451 (2014).
M. Ariga, et al., "Low Threshold GaInAsP Lasers with Semiconductor/Air Distributed Bragg Reflector Fabricated by Inductively Coupled Plasma Etching," Jpn. J. Appl. Phys. 39, 3406 (2000).
C. Zhang and J. E. Bowers, "Silicon photonic terabit/s network-on-chip for datacenter interconnection," Optical Fiber Technology 44, 2 (2018).
A. Spott et al., "Heterogeneously Integrated 2.0 μm CW Hybrid Silicon Lasers at Room Temperature," Opt. Lett. 40, 1480 (2015).
A. Spott et al., "Quantum Cascade Laser on Silicon," Optica 3, 545 (2016).
Y. Zhang et al., "Thin-Film Antimonide-Based Photodetectors Integrated on Si," IEEE J. Quant. Electron. 54, 4000207 (2018).
H. Nguyen-Van et al., "Quantum Cascade Lasers Grown on Silicon," Sci. Reports 8, 7206 (2018).
A. Spott et al., "Heterogeneously Integrated Distributed Feedback Quantum Cascade Lasers on Silicon," Photonics 3, 35 (2016).
A. Spott et al., "Interband Cascade Laser on Silicon," IEEE Photonics Conference (Oct. 1-5, 2017, Orlando FL).
A. Spott et al., "Interband Cascade Laser on Silicon," Optica 5, 996 (2018).
C. Zhang, "Low Threshold and High Speed Short Cavity Distributed Feedback Hybrid Silicon Lasers," Opt. Expr. 22, 10202 (2014).
J. V. Li et al., "Interband Cascade Detectors with Room Temperature Photovoltaic Operation," Appl. Phys. Lett. 86, 101102 (2005).
F. R. Giorgetta, "16.5 μm Quantum Cascade Detector Using Miniband Transport," Appl. Phys. Lett. 90, 231111 (2007).
H. Lotfi et al., "Monolithically Integrated Mid-IR Interband Cascade Laser and Photodetector Operating at Room Temperature," Appl. Phys. Lett. 109, 151111 (2016).
B. Schwarz et al., "Watt-Level Continuous-Wave Emission from a Bifunctional Quantum Cascade Laser/Detector," ACS Photonics 4, 1225 (2017).

(56) References Cited

OTHER PUBLICATIONS

M. C. Phillips et al., "Intracavity Sensing via Compliance Voltage in an External Cavity Quantum Cascade Laser," Opt. Lett. 37, 2664 (2012).
S. Kim, "Design and Analysis of Widely Tunable Sampled Grating DFB Laser Diode Integrated With Sampled Grating Distributed Bragg Reflector," IEEE Phot. Tech. Lett. 16, 15 (2004).
Forouhar et al., "Reliable Mid-Infrared Laterally-Coupled Distributed-Feedback Interband Cascade Lasers," Appl. Phys. Lett. 105, 051110 (2014).
Bagheri et al., "Passively mode-locked interband cascade optical frequency combs," Sci. Reports 8, 3322 (2018).
W. W. Bewley et al., "Single-Mode Interband Cascade Lasers with Coupled Ring Resonators," Conference on Lasers and Electro-Optics (2011).
T. H. Stievater et al., "Micromechanical Photothermal Spectroscopy of Trace Gases Using Functionalized Polymers," Opt. Lett. 37, 2328 (2012).
L. A. Sterczewski et al., "Mid-Infrared Dual-Comb Spectroscopy with Low Drive-Power On-Chip Sources," Opt. Lett. 44, 2113 (2019).
G. Villares et al., "Dual-Comb Spectroscopy Based on Quantum-Cascade-Laser Frequency Combs," Nature Commun. 5, 6192 (2014).
H. Lotfi et al., "High-Frequency Operation of a Mid-Infrared Interband Cascade System at Room Temperature," Appl. Phys. Lett. 108, 201101 (2016).
F. R. Giorgetta et al., "Quantum Cascade Detectors," IEEE J. Quant. Electron. 1039 (2009).
C. S. Kim et al., "Improved Mid-Infrared Interband Cascade Light Emitting Devices," Opt. Engr. 57, 011002 (2018).
M. C. Zheng et al., "High power spiral cavity quantum cascade superluminescent emitter," Opt. Expr. 23, 2713, (2015).
L. Shterengas et al., "Type-I Quantum Well Cascade Diode Lasers Emitting Near 3 µm," Appl. Phys. Lett. 103, 121108 (2013).
Igor Vurgaftman, et al., "Interband Cascade Lasers With Low Threshold Powers and High Output Powers," IEEE Journal of Selected Topics in Quantum Electronics, vol. 19, No. 4, pp. 1200210-1200210, Jul.-Aug. 2013.
George Hass and Lawrence Hadley, "The Optical Propertis of Metals," in American institute of physics handbook, edited by Dwight Gray (McGraw-Hill, New York, 1972), 3rd ed.
Search Report and Written Opinion dated Nov. 5, 2019 in corresponding International Application No. PCT/US2019/041521.
List of References in U.S. Appl. No. 16/509,613 Notice of Allowance dated Aug. 10, 2021.

\* cited by examiner

HIGHLY STABLE SEMICONDUCTOR LASERS AND SENSORS FOR III-V AND SILICON PHOTONIC INTEGRATED CIRCUITS

CROSS-REFERENCE

This Application is a Divisional of and claims the benefit of priority under 35 U.S.C. § 120 based on U.S. patent application Ser. No. 16/509,613 filed on Jul. 12, 2019, which in turn is a Nonprovisional of and claims the benefit of priority under 35 U.S.C. § 119 based on U.S. Provisional Patent Application No. 62/697,419 filed on Jul. 13, 2018. The prior applications and all references cited herein are hereby incorporated by reference into the present disclosure in their entirety.

TECHNICAL FIELD

The present disclosure relates to semiconductor lasers, particularly to edge-emitting semiconductor lasers that are more stable and that can operate with lower drive power than those currently available.

BACKGROUND

Instabilities of the output power and/or spectral characteristics of the laser source often limit the performance of optical systems used in such applications as coherent optical communications, length metrology, LIDAR, and spectroscopy-based chemical sensing. See, e.g., B. Tromborg et al., "Stability Analysis for a Semiconductor Laser," *IEEE J. Quant. Electron.* 20, 1023 (1984); V. Svedas, "The Significance of Lidar Pulse Stability in the IR Detection of Hazardous Compounds," *IEEE Sensors Journal* 14, 1391 (2014); and L. A. Sterczewski et al., "Multiheterodyne Spectroscopy Using Interband Cascade Lasers," *Opt. Engr.* 57, 011014 (2018).

A major source of instability is feedback from unwanted secondary optical cavities that form due to reflections from one or more surfaces encountered outside the intended primary cavity. The primary cavity of an edge-emitting diode laser is typically defined by coated or uncoated cleaved facets of the laser chip, although mirrors formed by distributed Bragg reflectors, etched facets, or other means may also be employed. While a parasitic secondary cavity may result from feedback within the chip, it is more often due to feedback from an external optic or other surface that is encountered after the beam leaves the output facet of the laser. See S. Takeda and S. Nakagawa, "Feedback Tolerance of DFB Laser for Silicon Photonics Packaging," *Opt. Expr.* 22, 8451 (2014).

Inevitable mechanical and thermal vibrations in a laser device cause the secondary cavity length to vary, which induces temporal "jitter" of the magnitude and spectral characteristics of the secondary lasing modes. Such instabilities in the lasing mode and output power can, for example, seriously degrade the sensitivity of a spectroscopy-based trace chemical measurement as a result of small variations in the laser signal transmitted through a sample gas or liquid. Although an optical isolator can minimize the feedback from external optical elements, the expense, bulk, and wavelength-specificity of such isolators make them unsuitable for incorporation into an ultra-compact chemical sensing system.

The cavity for a conventional narrow-ridge edge-emitting semiconductor laser is most commonly formed by cleaving two high-quality facets that define the two ends of the cavity. Typically, one of the facets (called the back facet) is coated for high reflection (HR), while the light generated within the laser is emitted from the other (front, or output) facet. The output facet may be left uncoated, in which case its reflectivity R is typically 25-40%, or it may be coated to optimize desired figures of merit. For example, the efficiency is generally maximized by applying an anti-reflection (AR) coating that reduces R to a few percent or less, whereas the threshold current density can be minimized by applying a coating with reflectivity higher than that of an uncoated facet (but which nonetheless allows some light to be transmitted to provide the laser output). Other means known to the art may also be employed to form the laser cavity, for example, by etching rather than cleaving one or both facets, or by processing distributed Bragg reflectors (DBRs) to provide reflection at one or both ends of the cavity. See, e.g., M. Ariga, et al., "Low Threshold GaInAsP Lasers with Semiconductor/Air Distributed Bragg Reflector Fabricated by Inductively Coupled Plasma Etching," *Jpn. J Appl. Phys.* 39, 3406 (2000).

When any of those conventional configurations are employed, the stability of the laser output can be compromised by unwanted feedback from optical elements residing outside the laser cavity. In the case of emission from an end facet, for example, external optical elements may reflect light back into the cavity to provide unwanted time-variant feedback.

In other cases, the laser cavity may be integrated on a chip with other optical components, and some means such as tapers and/or DBR mirrors may be employed to define the cavity, while transferring some fraction of the laser power into a waveguide for use elsewhere in a photonic integrated circuit (PIC).

Lasers have been integrated with other optical components to form PICs on III-V and silicon chips, as well as other substrate platforms. While a laser integrated in a PIC and emitting into a waveguide may experience little or no parasitic feedback from external optical elements, it may nonetheless may receive parasitic feedback from downstream optical elements residing elsewhere in the PIC.

PICs operating at telecommunications wavelengths in the near infrared have by now become relatively mature. See C. Zhang and J. E. Bowers, "Silicon photonic terabit/s network-on-chip for datacenter interconnection," *Optical Fiber Technology* 44, 2 (2018)]. On the other hand, PICs operating at longer wavelengths in the extended shortwave infrared (ESWIR, defined here as $\lambda$=2-3 µm), midwave infrared (MWIR, defined here as $\lambda$=3-6 µm), and longwave infrared (LWIR, defined here as $\lambda$=6-14 µm) spectral bands remain in the early stages of development. See e.g., U.S. Pat. No. 9,612,398 to Vurgaftman et al., entitled "Ultra-Broadband Photonic Integrated Circuit Platform"; see also A. Spott et al., "Heterogeneously Integrated 2.0 µm CW Hybrid Silicon Lasers at Room Temperature," *Opt. Lett.* 40, 1480 (2015); A. Spott et al., "Quantum Cascade Laser on Silicon," *Optica* 3, 545 (2016) ("Spott, *Optica* 2016"); and Y. Zhang et al., "Thin-Film Antimonide-Based Photodetectors Integrated on Si," *IEEE J. Quant. Electron.* 54, 4000207 (2018). Quantum cascade lasers (QCLs) with InAs quantum wells have recently been realized by growing the III-V gain material directly on a silicon chip. See H. Nguyen-Van et al., "Quantum Cascade Lasers Grown on Silicon," *Sci. Reports* 8, 7206 (2018). There have been several experimental demonstrations of midwave infrared (MWIR, 2.5-6 µm) QCLs and interband cascade lasers (ICLs) integrated on silicon. See e.g., '398 patent, supra; see also Spott, *Optica* 2016, supra;

A. Spott et al., "Heterogeneously Integrated Distributed Feedback Quantum Cascade Lasers on Silicon," *Photonics* 3, 35 (2016) ("Spott, *Photonics* 2016"); A. Spott et al., "Interband Cascade Laser on Silicon," IEEE Photonics Conference (1-5 Oct. 2017, Orlando Fla.); and A. Spott et al., "Interband Cascade Laser on Silicon," *Optica* 5, 996 (2018).

Most of these have been integrated on silicon chips, although the preliminary performance of such integrated devices has been limited in part by the challenge of bonding III-V wafer material to silicon and subsequent processing of the laser ridges from the back. Most often, the optical mode in the gain region of a silicon-based PIC is "hybrid," in that it is shared between the III-V gain material and an underlying silicon waveguide. See Spott, *Photonics* 2016, supra. Tapers of the III-V mesa material are then introduced at the boundaries between the hybrid and silicon waveguide sections, in order to adiabatically couple the generated light from one waveguide to the other. However, the performance of these MWIR PICs has been limited in part by inefficient transfer (to date) at the tapers of laser power from the "hybrid" III-V/silicon waveguide of the gain region to a passive silicon waveguide that is suitable for coupling the generated laser beam to other optical elements incorporated into a silicon-based PIC.

At shorter wavelengths in the near infrared (NIR), such tapers have provided efficient coupling between the two waveguide sections. See, e.g., C. Zhang, "Low Threshold and High Speed Short Cavity Distributed Feedback Hybrid Silicon Lasers," *Opt. Expr.* 22, 10202 (2014). In those integrated lasers, most of the optical mode in the hybrid waveguide resides in the silicon portion of the waveguide rather than the III-V portion, and so gradual tapering to a silicon waveguide introduces only a relatively minor perturbation of the mode profile.

However, the tapers employed in the integrated QCL and ICL demonstrations to date have induced much more reflection (and in some cases loss) than transmission of the laser beam propagating in the hybrid waveguide. This is probably due in part to the requirement for a much more abrupt evolution of the mode, which in the MWIR devices has been concentrated mostly in the III-V rather than the silicon portion of the hybrid waveguide. This mode distribution has been motivated by a concern that the gain would otherwise not be sufficient to overcome the higher waveguide loss at the longer wavelength, particularly in the case of a QCL that characteristically has relatively low material gain.

A number of demonstrations of interband cascade detectors (ICDs) and quantum cascade detectors (QCDs) have been reported in recent years. These have employed absorber and injector quantum well configurations quite similar to those used in corresponding laser structures that are designed for emission near the detector cut-off wavelength in the case of an ICD, see J. V. Li et al., "Interband Cascade Detectors with Room Temperature Photovoltaic Operation," *Appl. Phys. Lett.* 86, 101102 (2005), or near the intersubband resonance wavelength in the case of a QCD, see F. R. Giorgetta, "16.5 µm Quantum Cascade Detector Using Miniband Transport," *Appl. Phys. Lett.* 90, 231111 (2007).

In fact, ICDs have been processed on the same chip with ICLs, see H. Lotfi et al., "Monolithically Integrated Mid-IR Interband Cascade Laser and Photodetector Operating at Room Temperature," *Appl. Phys. Lett.* 109, 151111 (2016), and QCDs have been processed on the same chip with QCLs, see B. Schwarz et al., "Watt-Level Continuous-Wave Emission from a Bifunctional Quantum Cascade Laser/Detector," *ACS Photonics* 4, 1225 (2017), using the same multi-stage quantum well wafer material in both cases. ICDs and QCDs are capable of operating at room temperature, which is generally required for chemical sensing via evanescent coupling to a sample gas. It should be noted that neither the laser power nor the detector absorption per unit length needs to be high, since the optical beam generated by the laser can propagate a relatively long distance in the waveguide in the detector section of the chip, to allow spectroscopic detection based on attenuation by the fingerprint absorption features. However, the optical loss in the passive waveguide must be sensitive to absorption by the same gas, rather than being strongly dominated by other parasitic loss mechanisms.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a highly compact on-chip chemical sensor comprising one or more highly stable ICLs or QCLs integrated on a III-V or silicon chip with other optical components on the same chip. This will be accomplished by coupling the MWIR or LWIR laser source into a passive extended or resonant-cavity waveguide that provides evanescent coupling to a sample gas (or liquid) for spectroscopic chemical sensing. The uppermost layer of this passive waveguide has a relatively high index of refraction, enabling it to form the core of the waveguide, while the ambient air, consisting of the sample gas, functions as the top cladding layer. A fraction of the propagating light beam is absorbed by the sample gas if it contains a chemical species having a fingerprint absorption feature within the spectral linewidth of the laser emission.

For the on-chip sensor embodiments which incorporate the sensor waveguide into the laser cavity in accordance with the present invention, the measured signal corresponds to the ratio of differential absorption induced by the sample gas to the net loss in the cavity, i.e., the sum of internal losses in the various waveguide sections and reflection losses at the two ends of the cavity. It follows that the minimum differential absorption that can be detected depends critically on the laser stability, since any jitter or other fluctuation in the laser operation will wash out a small differential signal. Therefore, it is highly beneficial that the highly stable laser in accordance with the present invention, which has no optical interactions at all with the outside world apart from evanescent coupling to the sample gas, is highly useful in such on-chip sensors.

In embodiments for which optical output from the laser cavity is required, the invention provides a means for isolating the laser(s) to the maximum degree possible from any interactions with optical elements external to the laser cavity or with other optical elements in a PIC. Rather than coupling a substantial fraction of the laser power out of the cavity or elsewhere on the chip at some point during each pass through the cavity, the cavity is formed by two HR mirrors that are independent of the light extraction so that only a small, adjustable fraction of the power is extracted during each pass through the cavity via evanescent coupling to a passive waveguide. While the maximum output power and power conversion efficiency may in some cases be reduced somewhat, the threshold current and threshold drive power are minimized by the substantial reduction of loss at the output mirror, as well as by the potential for reducing the cavity length (e.g., to «1 mm) if the mirror loss can be minimized. The laser's increased stability and reduced drive power may be exploited in configurations that emit the beam from the chip for use in an external system, or as an optical source component of a PIC.

The invention also provides a framework for constructing fully integrated photonic integrated circuits, and especially for creating III-V PICs on the native substrates of interband and quantum cascade laser structures. A III-V PIC designed in accordance with the invention will be much simpler and less expensive to process with high yield than a Si-based PIC that integrates multiple III-V active components. The numerous optical elements that may be incorporated into a single III-V PIC include lasers, detectors, passive waveguides, sensing waveguides that evanescently couple to an ambient sample gas, and arrayed waveguide gratings (AWGs) for spectral beam combining and separating.

The present invention can be utilized for any one or more of these configurations. For example, the invention may be used to construct an ultra-compact chemical sensing system that combines one or more ICL or QCL sources, one or more ICDs or QCDs, passive sensing waveguides, and passive connecting waveguides, all on the same III-V chip. In some embodiments, the invention can provide a chemical sensing system based on dual-comb spectroscopy that employs two highly stable ICL frequency combs integrated on the same chip with a passive sensing waveguide and ICD. PICs incorporating various ICL/ICD and QCL/QCD designs can provide on-chip chemical sensors designed for highly stable room-temperature cw operation at wavelengths from <2.5 µm to >11 µm. In fact, it should be possible to extend this range to longer wavelengths, since a QCL emitting at a given wavelength may be expected to operate to a somewhat higher temperature when both ends of the laser cavity are defined by HR mirrors, as in many embodiments of the invention, than for a conventional design having an HR mirror at only one end of the cavity.

BRIEF DESCRIPTION OF THE DRAWINGS

FIG. 4A illustrates an overall view of such an embodiment and FIG. 4B provides a detailed view of the boundary between the gain section of the laser cavity and the passive waveguide section of the laser cavity.

DETAILED DESCRIPTION

Figure 1:
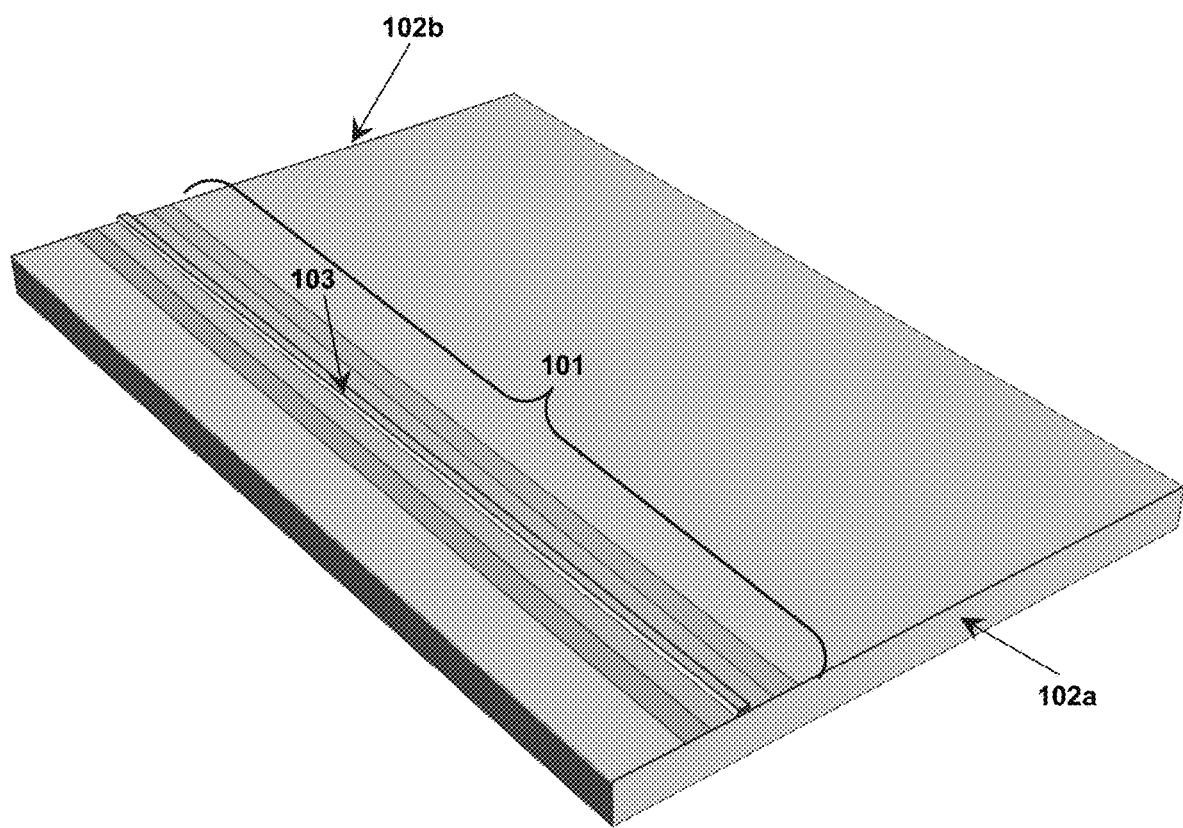
FIG. 1 is a block schematic illustrating an exemplary embodiment of a highly stable laser in accordance with one or more aspects of the present disclosure.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a highly compact on-chip chemical sensor comprising one or more highly stable ICLs or QCLs integrated on a III-V or silicon chip with other optical components on the same chip. This will be accomplished by coupling the MWIR or LWIR laser source into a passive extended or resonant-cavity waveguide that provides evanescent coupling to a sample gas (or liquid) for spectroscopic chemical sensing. The uppermost layer of this passive waveguide has a relatively high index of refraction, enabling it to form the core of the waveguide, while the ambient air, consisting of the sample gas, functions as the top cladding layer. A fraction of the propagating light beam is absorbed by the sample gas if it contains a chemical species having a fingerprint absorption feature within the spectral linewidth of the laser emission.

For the on-chip sensor embodiments which incorporate the sensor waveguide into the laser cavity in accordance with the present invention, the measured signal corresponds to the ratio of differential absorption induced by the sample gas to the net loss in the cavity, i.e., the sum of internal losses in the various waveguide sections and reflection losses at the two ends of the cavity. It follows that the minimum differential absorption that can be detected depends critically on the laser stability, since any jitter or other fluctuation in the laser operation will wash out a small differential signal. Therefore, it is highly beneficial that the highly stable laser in accordance with the present invention, which has no optical interactions at all with the outside world apart from evanescent coupling to the sample gas, is highly useful in such on-chip sensors.

For embodiments in which light is output from the laser cavity, either for emission from the chip or for use elsewhere in a PIC residing on the chip, high laser stability is accomplished by isolating the laser(s) to the maximum degree possible from any interactions with optical elements external to the laser cavity or with other optical elements in a PIC. Rather than coupling a substantial fraction of the laser power out of the cavity or elsewhere on the chip at some point during each pass through the cavity, the cavity is formed by two HR mirrors that are independent of the light extraction so that only a small, adjustable fraction of the power is extracted during each pass through the cavity via evanescent coupling to a passive waveguide. While the maximum output power and power conversion efficiency may in some cases be reduced somewhat, the threshold current and threshold drive power are minimized by the substantial reduction of loss at the output mirror, as well as by the potential for reducing the cavity length (e.g., to <<1 mm) if the mirror loss can be minimized. The laser's increased stability and reduced drive power may be exploited in configurations that emit the beam from the chip for use in an external system, or as an optical source component of a PIC.

The invention also provides a framework for constructing fully integrated photonic integrated circuits, and especially for creating III-V PICs on the native substrates of interband and quantum cascade laser structures. A III-V PIC designed in accordance with the invention will be much simpler and less expensive to process with high yield than a Si-based PIC that integrates multiple III-V active components. The numerous optical elements that may be incorporated into a single III-V PIC include lasers, detectors, passive waveguides, sensing waveguides that evanescently couple to an ambient sample gas, and arrayed waveguide gratings (AWGs) for spectral beam combining and separating.

The present invention can be utilized for any one or more of these configurations. For example, the invention may be used to construct an ultra-compact chemical sensing system that combines one or more ICL or QCL sources, one or more ICDs or QCDs, passive sensing waveguides, and passive connecting waveguides, all on the same III-V chip. In some embodiments, the invention can provide a chemical sensing system based on dual-comb spectroscopy that employs two highly stable ICL frequency combs integrated on the same chip with a passive sensing waveguide and ICD. PICs incorporating various ICL/ICD and QCL/QCD designs can provide on-chip chemical sensors designed for highly stable room-temperature cw operation at wavelengths from <2.5 µm to >11 µm. In fact, it should be possible to extend this range to longer wavelengths, since a QCL emitting at a given wavelength may be expected to operate to a somewhat higher temperature when both ends of the laser cavity are defined by HR mirrors, as in many embodiments of the invention, than for a conventional design having an HR mirror at only one end of the cavity.

As described in more detail below, the building blocks needed to construct an on-chip chemical sensor in accordance with the invention include (1) a highly stable laser source, (2) low-loss passive waveguides or actively pumped/amplifying sections to enable interconnections, (3) a passive sensing waveguide with evanescent coupling to a sample gas or liquid, and (4) an interband or quantum cascade detector. Each of these is described below.

In some embodiments, the top of the waveguide in the sensing region may be coated with a chemical sorbent with a distinct absorption signature that selectively attaches a certain class of chemicals that diffuse into the sorbent from the sample gas. This can significantly enhance the absorption associated with a given concentration of molecules in the sample gas. Such a sensor on a single chip may provide spectroscopic sensing over some range of wavelengths between ≈2.5 µm and ≈6 µm when an interband cascade structure provides the optical sources and detectors on a III-V chip, or over some range of wavelengths between ≈4 µm and ≈12 µm when a quantum cascade structure provides the optical sources and detectors on a III-V chip. When III-V active gain and detector materials are bonded to a silicon chip to form the PIC, sources and detectors operating at any number of MWIR and LWIR wavelengths may in principle be combined on the same chip.

The present invention provides a novel and effective means for strongly suppressing laser instabilities associated with unintended external feedback. By much more effectively isolating the laser cavity on the chip, the invention substantially reduces all interactions with external elements. Although the enhanced laser stability may sometimes be traded against a reduction of the maximum output power and power conversion efficiency, an additional benefit is the potential for substantially reducing the threshold drive power required to operate the laser. For some applications these trades may be highly advantageous.

In the case of a III-V PIC, attenuation of the infrared light beam propagating in the passive waveguide is quantified by an ICD or QCD fabricated from the same III-V multi-stage active quantum well structure as the ICL or QCL. Whereas a forward bias is required to produce gain and lasing, an ICD or QCD is typically operated at or near zero bias, although a reverse bias or sub-threshold forward bias may also be applied.

Some embodiments of the present invention obviate the issue of inefficient coupling of the active and passive waveguides at the tapers, by replacing them with a more reliable means for coupling between different waveguide sections. In embodiments of the invention that employ a PIC on a III-V chip, no transfers between hybrid and silicon waveguides are required at all.

These and other features of various embodiments of highly stable lasers and sensors integrated on the same chip are now described with reference to the FIGURES which are filed concurrently herewith and which form a part of the present disclosure. It will be noted that in the FIGURES and in the description below, elements that appear in more than one FIGURE are denoted by the same reference number, with only the first digit being changed to reflect the number of the FIGURE being described. For example, a laser cavity of a highly stable laser in accordance with the present invention is denoted as "laser cavity 101" when discussed in the context of FIG. 1 and as "laser cavity 601" when discussed in the context of FIG. 6; similarly, the narrow-ridge laser waveguide is denoted with reference number 103 in FIG. 1 and with reference number 403 in FIG. 4.

A highly stable interband or quantum cascade laser in accordance with the present invention is formed by creating a laser cavity with very weak interactions with any optical elements outside the cavity.

The block schematic in FIG. 1 illustrates a simplest embodiment of a highly stable laser in accordance with the present invention.

As illustrated in FIG. 1, such a highly stable laser includes a laser cavity 101 consisting of an ICL or QCL narrow-ridge waveguide 103 bounded by a mirror at each end of the cavity.

In this baseline configuration, the laser experiences no interactions at all with optical elements outside the laser cavity. The laser cavity illustrated in FIG. 1 is defined by two end facets 102*a*/102*b* that are each coated with a high-reflectivity (HR) metal such as Au, with a dielectric spacer to prevent electrical shorting. In this embodiment, the two end facets are formed by cleaving the wafer from which the cavity is formed. In other embodiments, other highly reflecting end mirrors, such as etched facets with HR coatings or distributed Bragg reflectors (DBRs), may be employed at one or both ends of the cavity. While ≈0.5 mm represents a practical limit to the minimum cavity length that can be formed with high yield by conventional cleaving methods, shorter cavity lengths are more straightforward if a portion of the waveguide curves such that the mirrors defining both ends of the cavity are provided by the same HR-coated cleaved facet, as discussed below, or if the cavity is defined by etching one or both facets or by processing DBRs.

A highly stable laser in accordance with the present invention may be induced to lase in a single spectral mode by first requiring the laser ridge to be narrow enough to support lasing in only a single lateral mode. DBRs may then be used at one or both ends of the laser cavity to select a single longitudinal mode, while in other embodiments, the ridge may be patterned with a distributed feedback (DFB) grating. Since there is no opportunity for feedback from an external optical element to influence operation of the laser, its stability is likely to be determined primarily by the stability of the drive electronics or by thermal fluctuations from the environment (which typically take place on a relatively long time scale). Vibrations should have little effect, since all of the internal lengths are fixed and the reflectors defining the cavity should generally vibrate in unison.

In some embodiments, the laser ridge may be processed on its native III-V chip using conventional fabrication methods, while in other embodiments, it may be integrated on a silicon chip by growing the III-V active gain material on silicon or by growing on the native III-V substrate and then bonding to silicon as discussed above. Processing on the native III-V chip rather than silicon is generally more straightforward and less expensive, and is likely to produce higher yield.

Of course, a laser having no interaction at all with anything outside its own cavity cannot perform any useful function. However, interaction can be obtained without introducing any potential for feedback from external optical elements by evanescently coupling some or all of the laser's ridge waveguide to an ambient sample gas or liquid.

In all of the embodiments of the invention described below, a common bottom contact on the substrate of the ICL or QCL wafer is employed, although embodiments with both contacts made to the top of the wafer may also employ the same inventive aspects. A substantial fraction of the optical mode resides in the top and bottom $n^-$-GaSb separate confinement layers (SCLs), which exhibit low loss and high refractive index.

Figure 2:
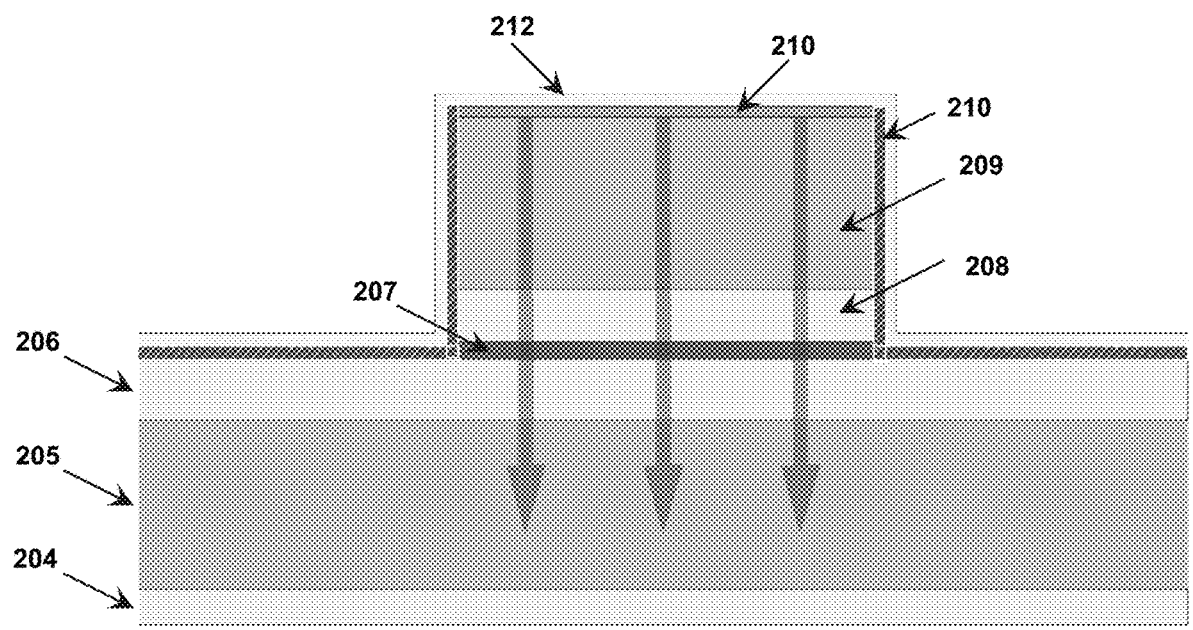
FIG. 2 is a block schematic illustrating a cross-sectional profile for an interband cascade laser (ICL) with a narrow-ridge waveguide formed by etching through the active stages in accordance with the prior art.

The block schematic in FIG. 2 illustrates a typical cross section for a conventional ICL narrow-ridge waveguide that is formed by processing ICL wafer material which is typically grown by molecular beam epitaxy. In preferred embodiments, the sidewalls of the ridge waveguide of the narrow-ridge ICL are etched to below the active stages to prevent current spreading in the wafer.

The conventional narrow-ridge waveguide shown in FIG. 2 is formed by processing ICL wafer material that includes an $n^+$-GaSb substrate 204 with an n-InAs/AlSb superlattice bottom clad 205 on an upper surface thereof, a bottom GaSb separate confinement layer (SCL) 206 on an upper surface of bottom clad 205, active ICL gain stages 207 on an upper surface of SCL 206, a top GaSb SCL 208 on an upper surface of the active gain stages, an n-InAs/AlSb superlattice top clad 209 on an upper surface of top SCL 208, and a thin $n^+$-InAs or $n^+$-InAsSb top contact layer 210 on an upper surface of top clad 209. A layer of a dielectric 211 such as SiN is deposited on the ridge sidewalls, followed by metallization on top of the ridge to provide a top electrical contact 212. The bottom contact (not shown) is usually made to $n^+$-GaSb substrate 204. The arrows in FIG. 2 indicate the direction of current flow when a forward bias is applied to produce gain for lasing.

Figure 3:
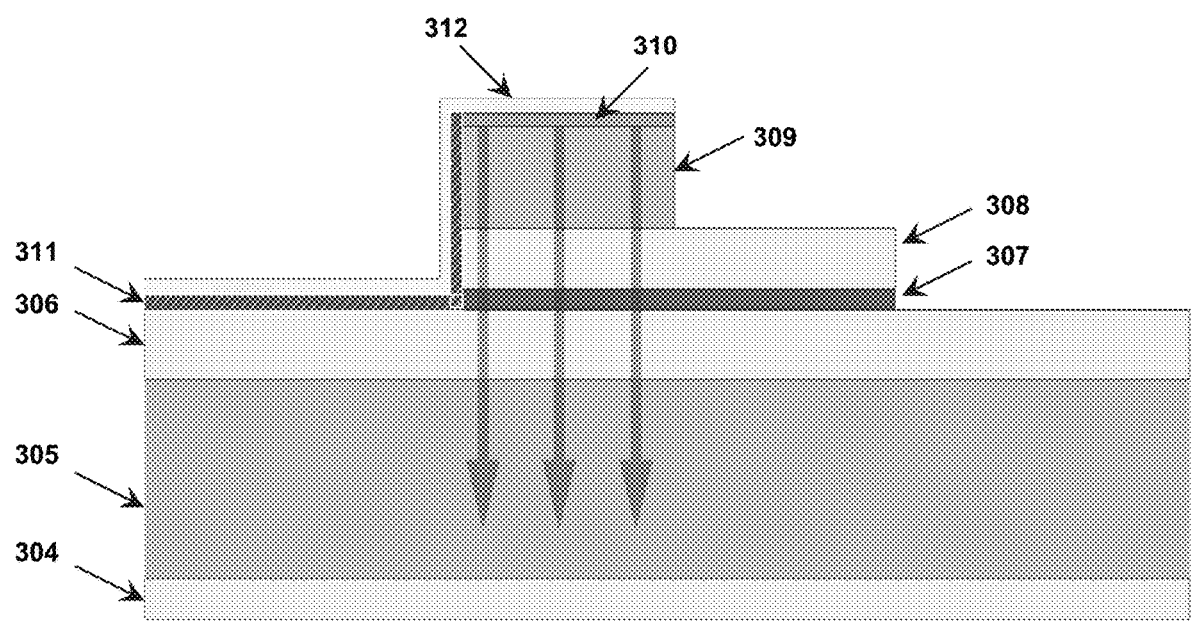
FIG. 3 is a block schematic illustrating a cross-sectional profile for an exemplary ICL embodiment of a highly stable laser in accordance with one or more aspects of the present disclosure, in which part of the top SCL and one sidewall of the narrow ridge are exposed to the ambient to allow evanescent coupling of the lasing mode to a sample gas or liquid.

The block schematic in FIG. 3 illustrates the cross section for an exemplary embodiment of an alternative ICL ridge waveguide that is modified such that part of the top SCL is exposed to ambient to provide evanescent coupling of the lasing mode to a sample gas or liquid. As illustrated in FIG. 3, such an alternative ICL ridge waveguide, like the conventional waveguide described above with respect to FIG. 2, includes an $n^+$-GaSb substrate 304 with an n-InAs/AlSb superlattice bottom clad 305 on an upper surface thereof, a bottom GaSb separate confinement layer (SCL) 306 on an upper surface of bottom clad 305, active ICL gain stages 307 on an upper surface of SCL 306, a top GaSb SCL 308 on an upper surface of the active gain stages 307, an n-InAs/AlSb superlattice top clad 309 on an upper surface of top SCL 308, and a thin $n^+$-InAs or $n^+$-InAsSb top contact layer 310 on an upper surface of top clad 309. After the narrow-ridge waveguide has been etched, a dielectric layer 311 is deposited on the sidewalls to prevent electrical shorting and metal is deposited to form a top contact 312.

Unlike the conventional waveguide shown in FIG. 2, in the waveguide in accordance with the embodiment of the present invention illustrated in FIG. 3, one sidewall of the active ICL stages 307, the top SCL 308, and top clad 309, as well as a portion of bottom SCL 306 are exposed to permit coupling of the lasing mode to an ambient sample gas or liquid. The lasing threshold, slope efficiency, and maximum output power then provide information about whether the ambient sample gas contains any trace chemicals with absorption features at the laser wavelength.

Numerous variations of this exemplary embodiment will be obvious to one skilled in the art. For example, in some variations, a double ridge may be formed to provide weak index guiding of the lasing mode, with the inner ridge etched to a depth above the active stages and the outer ridge etched to below the active stages. In other cases, ion bombardment can optionally be used to prevent current spreading into the outer ridge, as is described in U.S. Pat. No. 9,960,571 to Meyer et al., entitled "Weakly Index-Guided Interband Cascade Lasers with No Grown Top Cladding Layer or a Thin Top Cladding Layer." As noted above, by depositing the dielectric and top contact metallization on only part of the ridge, the rest can remain exposed to ambient. In still other cases, a DFB grating may also be patterned into the ridge, e.g., by etching into the III-V material or by depositing Ge and patterning the grating in the Ge. See '571 patent, supra.

A closely analogous embodiment can be constructed using QCL gain stages for the highly stable laser rather than ICL gain stages. For the well-known case of an InP-based QCL, the substrate is InP, the active stages typically employ strain-compensated InGaAs—InAlAs quantum wells, the top and bottom cladding layers are typically n-InP, and a top and/or bottom InGaAs SCL may optionally be incorporated to maximize overlap of the optical mode with the sample gas surrounding the laser. Numerous other variations of the ridge geometry and material constituents will be obvious to one skilled in the art, and all such variations are deemed to be within the scope of the present disclosure.

QCLs can operate with high performance extending from MWIR wavelengths of 4 µm or shorter to LWIR wavelengths beyond 10 µm, and all of the embodiments of the invention discussed below that pertain to ICLs and/or ICDs apply equally to QCLs and/or QCDs operating at both MWIR and LWIR wavelengths.

Figure 4A:
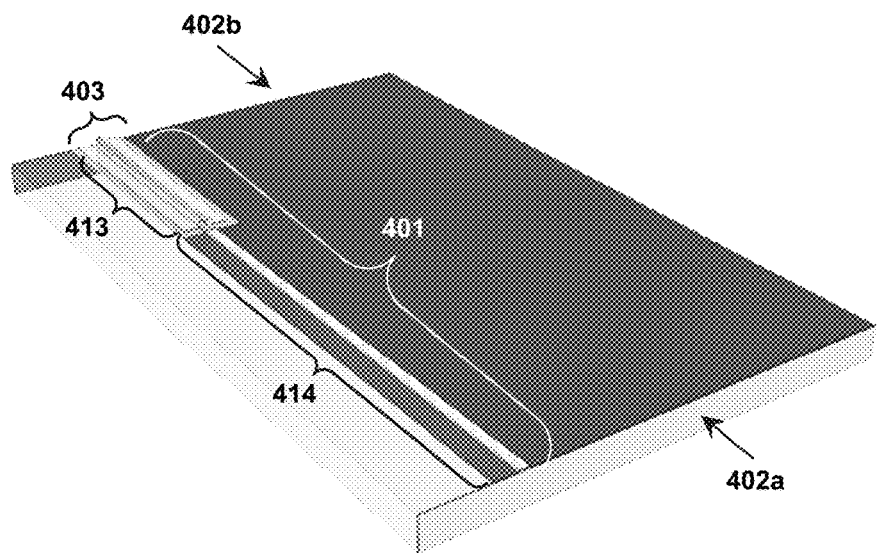
FIGS. 4A and 4B are block schematics illustrating aspects of another exemplary embodiment of a highly stable laser in accordance with one or more aspects of the present disclosure, where
Figure 4B:
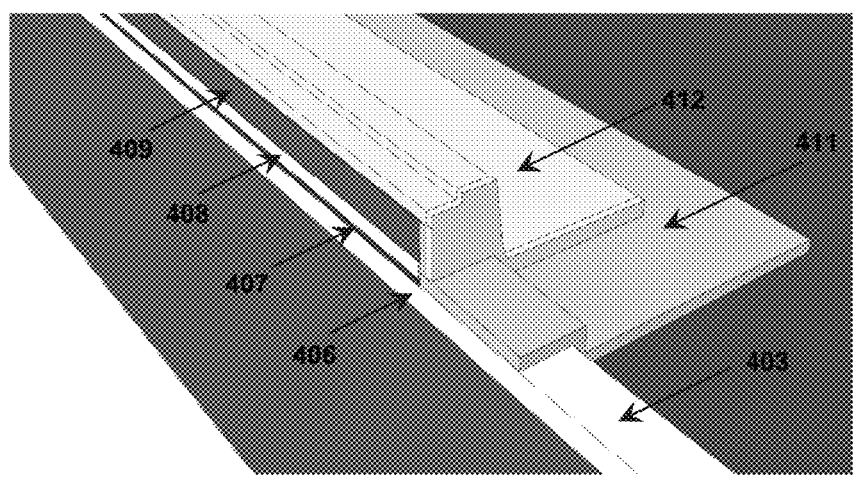

The block schematics in FIGS. 4A and 4B illustrate aspects of an exemplary embodiment of a highly stable laser that provides evanescent coupling of the laser beam propagating in the cavity to a sample gas or liquid.

As seen in FIG. 4A, a highly stable laser in accordance with this embodiment of the present invention includes a laser cavity 401 that is divided longitudinally into active and passive sections 413 and 414, respectively, where the active waveguide section includes a narrow-ridge waveguide 403. At each end of the laser cavity is an HR-coated cleaved facet 402a/402b. In other embodiments, high reflection is provided at both ends of the laser cavity by DBR mirrors rather than HR-coated facets. The top of the passive waveguide is exposed to an ambient to provide evanescent coupling of the lasing mode to a sample gas or liquid.

FIG. 4B illustrates an exemplary configuration of the boundary between the active ICL or QCL narrow-ridge waveguide section and the passive waveguide section of a highly stable laser in accordance with the present invention. While an additional reflection will occur at the boundary between the active and passive waveguide sections, due to mismatch of the modal profiles in the two sections, generally this should not seriously degrade the spectral mode selectivity.

As illustrated in FIG. 4B, such an exemplary waveguide structure includes the components previously described above with respect to FIG. 2, including a bottom SCL 406, ICL (or QCL) active gain stages 407, top SCL 408, top clad 409, and a thin top contact layer (not shown). The active narrow-ridge waveguide shown in FIG. 4B further includes a dielectric layer 411 on the sidewalls of the active narrow-ridge waveguide and a top metal contact layer 412 disposed on an upper surface of the top contact layer. At the boundary between the active and passive waveguides, the upper portion of the active waveguide is preferably HR-coated with a dielectric insulator and metal so that light which would otherwise be emitted into the ambient above the passive waveguide is reflected back into the laser cavity.

Figure 5A:
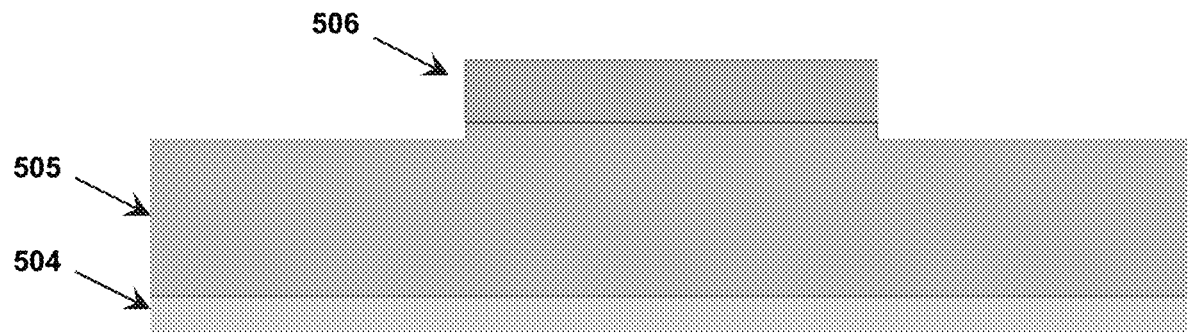
FIGS. 5A and 5B are block schematics illustrating cross sections of exemplary passive waveguide embodiments that can be processed from a full ICL structure in accordance with one or more aspects of the present disclosure.
Figure 5B:
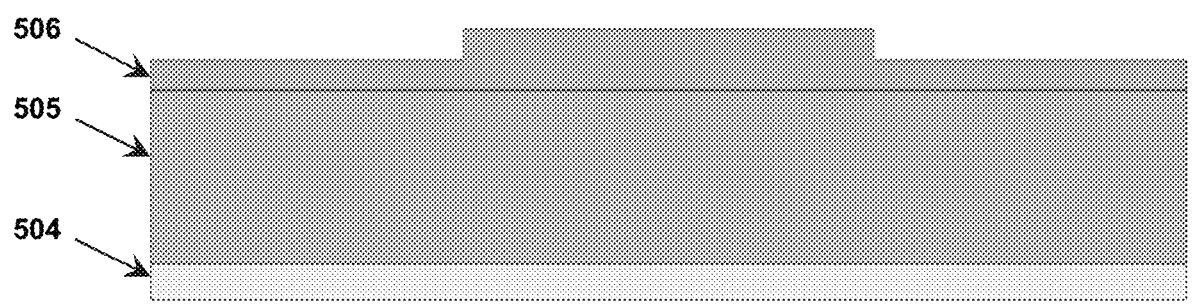

The block schematics in FIGS. 5A and 5B illustrate two exemplary cross-sections of a low-loss passive waveguide section in a highly stable semiconductor laser in accordance with the present invention. These passive waveguides are formed on the same chip using the same ICL wafer material as is used for the active waveguides, with either an active or passive waveguide selected by changing the etching and other processing of a given region of the chip.

As can be seen in FIGS. 5A and 5B, in exemplary embodiments, each of these passive waveguides includes an $n^+$-GaSb substrate 504, an n-InAs/AlSb superlattice bottom clad 505, and a bottom GaSb SCL 506, though other materials (superlattice or bulk materials) can be used as appropriate. The ridge for each of these passive waveguides is formed by etching away the heavily-doped top contacting layer, the top cladding layer, the top SCL, and the active gain stages, with the etch stopping near the top of the bottom SCL 506, to provide an air top clad for the waveguide. In these embodiments, the ICL waveguide may be redesigned so that the bottom SCL is thicker than the top SCL, which can be done with only a modest reduction of the optical confinement factor for the lasing mode in the ICL. In addition, in order to avoid parasitic emission into the air above the passive waveguide due to the height and modal profile differences between the active and passive waveguides at the boundary between the active and passive waveguides, the upper portion of the active waveguide should preferably be HR coated at the interface between the active and passive waveguides.

In the embodiment shown in FIG. 5A, part of the InAs/AlSb superlattice bottom cladding layer 505 is also removed laterally outside the ridge, with the etch that forms the sidewalls of the passive waveguide stopping near the top of InAs/AlSb superlattice bottom cladding layer 505. Alternatively, in the embodiment shown in FIG. 5B, the etch that forms the sidewalls of the passive waveguide stops within the bottom SCL 506.

In both cases, the air top clad of the passive waveguide in accordance with the present invention is suitable for evanescently coupling the optical mode propagating in the waveguide to an ambient sample gas. The beam propagates in the ridge waveguide formed by the bottom $n^-$-GaSb SCL 506 as its core, the bottom superlattice cladding layer 505 (along with a portion of bottom SCL in the embodiment of FIG. 5B) as its bottom clad, and air as its top clad. The top of the passive waveguide is exposed to the ambient to provide evanescent coupling of the propagating beam to the sample gas or liquid. DFB gratings may be added in the active waveguide section of the cavity in a manner described below, or spectral mode selectivity may be imposed by processing DBR gratings at one or both ends of the cavity, rather than by terminating both ends of the cavity by cleaved facets with HR coatings. In either embodiment, the layer thicknesses, waveguide widths, and etch depths must be designed such that light propagating through the passive waveguide can be optically confined. In addition, in both embodiments, the tops and sides of the waveguide are suitable for evanescently coupling the propagating light to an ambient sample gas or liquid.

In other cases, a structure analogous to the one shown in FIG. 5A or FIG. 5B can be used to construct a highly stable QCL in which the passive waveguide section is formed using a thick bottom InGaAs SCL as the core and the InP lower cladding layer of the laser as the clad.

Numerous variations on the waveguide geometry and material constituents for this passive waveguide will be obvious to one skilled in the art. In some embodiments, the passive waveguide sections can be made relatively long, e.g., as long as 1 cm or more, to enhance the chemical detection sensitivity, since in most cases the passive waveguide loss will be low and absorption by the sample gas weak unless the chemical species of interest is present with a high concentration. In some embodiments, the passive waveguide extending from the gain region to the end of the cavity may follow a straight path. In other embodiments, it may follow a winding path that provides the same total passive waveguide length with greater compactness on the chip. In some embodiments, the winding or curved path of the passive waveguide may terminate at a mirror provided by the same HR-coated cleaved facet as the mirror at the other end of the cavity. Embodiments in which the mirrors defining both ends of the laser cavity are provided by termination at the same HR-coated cleaved facet will be discussed further below.

The spectral characteristics of the beam propagating in the highly stable laser cavity are modified by the presence or absence of a chemical species of interest. As a result, a highly stable laser in accordance with the present invention can be incorporated into a sensor to detect the presence of a chemical species in a sample gas incident on the sensor, where the presence of the gas is detected through changes in the threshold current, slope efficiency, and/or power of the highly stable laser operating in the cavity.

In some embodiments, the presence of a chemical species in a sample gas can be detected by monitoring the compliance voltage in the I-V characteristics of the highly stable laser when a constant current is injected. See M. C. Phillips et al., "Intracavity Sensing via Compliance Voltage in an External Cavity Quantum Cascade Laser," *Opt. Lett.* 37, 2664 (2012). When the loss due to absorption of the laser beam by the sample gas increases, the lasing threshold increases and the radiative recombination rate decreases at a given current injection level above threshold. Therefore, a higher voltage must be applied to maintain the same current. Phillips et al., supra, observed a 0.15 V increase of the compliance voltage for a QCL emitting near 7.7 μm when the laser wavelength was swept across an absorption line of water vapor. In that experiment, the sample gas resided in an external region of the laser cavity (which also provided tuning of the laser wavelength), rather than being evanescently coupled to the beam propagating in a passive waveguide.

Without an external cavity to tune the wavelength, the present invention can sweep across the absorption resonance by current or temperature tuning, where the dependence of compliance voltage on current is compared to that observed when the chemical species of interest is not present in the sample gas or liquid. In other embodiments, different lasers on the same chip can be tuned to different DFB or DBR wavelengths to provide a reference.

The compliance voltage method for monitoring absorption by the sample gas may be combined with either evanescent coupling within the gain region, as in the case shown in FIG. 1 with an active waveguide cross section such as that shown in FIG. 3, or when the waveguide in the laser cavity is divided into active and passive sections as shown in FIG. 4A.

For the case of an ICL, the passive waveguide could have a cross section such as that shown in FIG. 5A or FIG. 5B. Measurement of the compliance voltage to monitor absorption by the sample gas can be applied either to ICLs or, as in the experiment reported by Phillips et al., to QCLs.

A second method for monitoring absorption by the sample gas of a laser beam propagating within a highly stable laser cavity is to incorporate an additional detector waveguide section into the laser cavity.

Figure 6:
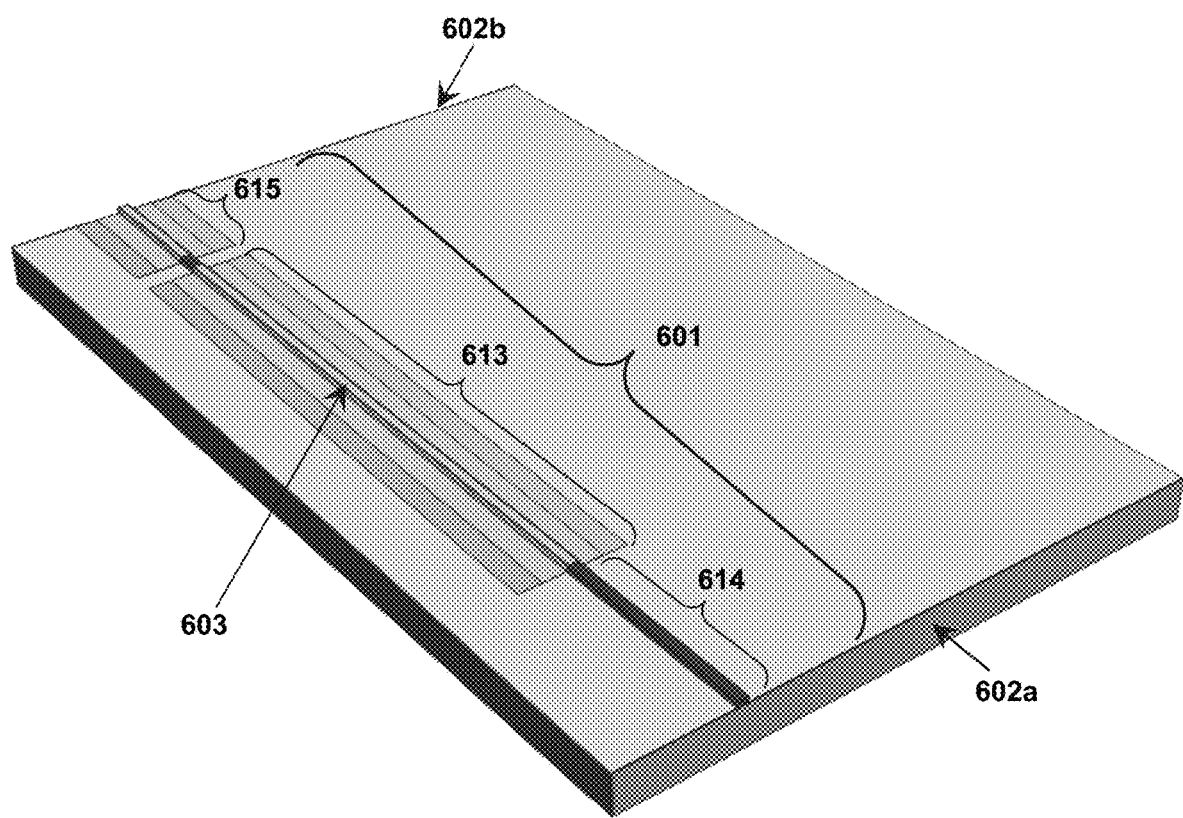
FIG. 6 is a block schematic illustrating an exemplary embodiment of a chemical sensor that incorporates a detector waveguide section, an active gain waveguide section, and a passive waveguide sensing section into the cavity of a highly stable laser in accordance with one or more aspects of the present disclosure.

This is shown schematically in FIG. 6. Thus, a sensor in accordance with the embodiment illustrated in FIG. 6 includes a laser cavity 601 having HR-coated end facets 602a/602b, although in other embodiments high reflection is provided at both ends of the laser cavity by DBR mirrors rather than HR-coated facets. The laser cavity contains a detector waveguide section 615 on one side of an active gain waveguide 613, with a passive sensing waveguide 614 section on the other side of the active gain waveguide, where the top surface of the passive waveguide is exposed to the ambient to provide evanescent coupling of the propagating optical mode to a sample gas or liquid as in the discussion above. In other embodiments, the detector waveguide section and the sensing waveguide section may be positioned on the same side of the active gain waveguide, rather than on opposite sides. The photocurrent measured by the detector, which may be an ICD or QCD, depends on the intensity of the light propagating in the laser cavity. The lasing wavelength can be tuned by varying the operating temperature, by varying the current flowing through the active gain waveguide, or by other means; in such cases, the intensity of the light propagating in the laser cavity will depend on the spectral characteristics of the absorption of the optical mode due to its evanescent coupling to the sample gas in the sensing waveguide section. The photocurrent measured by the detector will then provide information about the spectral characteristics of the absorption by the sample gas.

In other embodiments, the detector may also be placed inside the laser cavity when evanescent coupling to the sample gas occurs within the active gain section, as in the embodiments illustrated in FIG. 1 and FIG. 3. In such cases, the laser cavity includes an active gain waveguide section and a detector waveguide section, but no separate passive waveguide section. The active gain waveguide section and detector waveguide section must be separately contacted, with a gap in between to prevent crosstalk between the two sections. In some embodiments, a DBR may be positioned between the gain and detector sections of the waveguide to reduce the loss of the laser cavity. The DBR can cause the laser to operate in a single spectral mode, preferably with the detector waveguide extending beyond its absorption length before another reflecting element is encountered. Alternatively, if a second DBR is placed at the other end of the detector waveguide, the detector can be made to function as a resonant cavity IR detector (RCID) with the same resonance wavelength as the laser. See U.S. Pat. No. 10,297,699 to Meyer et al., entitled "In-Plane Resonant-Cavity Infrared Photodetectors with Fully-Depleted Absorbers." The opposite end of the laser cavity can be defined by an additional DBR, or by a broadband HR mirror such as a coated cleaved facet.

As noted above, both ICLs and QCLs may be operated as detectors if zero bias, a reverse bias, or a sub-threshold forward bias is applied rather than the above-threshold forward bias needed to produce lasing, with the resulting photocurrent being monitored to quantify the strength of the propagating optical signal. See Li et al., supra, and Giorgetta et al. (2007), supra.

In the example of an ICL operated under forward bias to produce gain, the electron injector with chirped quantum well thicknesses transfers electrons from the semimetallic interface to the active electron quantum wells, where they recombine with holes in the active hole quantum well. In an ICD, however, electrons that are photoexcited in the active quantum wells of a given stage flow "downhill" through the electron injector toward the semimetallic interface, where they recombine with photoexcited holes from the next stage. Thus, whereas a single electron injected electrically into an N-stage ICL can produce N photons, an ICD requires N photons to transfer a single electron across all the stages to provide photocurrent. The cut-off wavelength of the ICD is roughly equal to the emission wavelength of the ICL, since both are determined by the bandgap of the active quantum wells and that bandgap does not change substantially with the application of a forward or reverse bias. Whereas the photocurrent must compete with the noise induced by thermally-generated electrons that traverse the same path, a very high detectivity is not required because the detector residing inside the laser cavity experiences a high photon flux.

However, the detector waveguide section of the laser cavity must be short enough that loss associated with absorption of the lasing photons does not seriously degrade the laser performance. To minimize the loss, it may be advantageous to apply a sub-threshold forward bias to the detector waveguide section of the cavity, which will lower the loss in the cavity while still allowing photocurrent to be generated. The advantage of lower loss must be weighed against the disadvantage that the detector noise current will be higher when a sub-threshold forward bias is applied. It may, in fact, be beneficial to monitor the detector response as a function of sub-threshold bias current.

The operation of a quantum cascade detector is quite similar, except that intersubband absorption then provides photocurrent across the active stages when a reverse, zero, or sub-threshold forward bias is applied to the structure. In the case of a QCD, the maximum absorption in the detector waveguide section occurs at a wavelength that is noticeably longer than the same structure's QCL emission wavelength, since before absorption the electrons in thermal equilibrium or quasi-thermal equilibrium reside primarily in a subband that is about two optical phonon energies lower than the subband corresponding to the lower lasing level. The role of the lower subband is to ensure rapid depopulation of the lower lasing level following stimulated emission. In spite of this mismatch, the higher subband that contributes to absorption at the emission wavelength is sufficiently populated at room temperature for the absorption coefficient to reach several $cm^{-1}$, according to simulations by the inventors. In many cases this will be sufficient to allow the light intensity propagating in the detector waveguide section of the laser cavity to be monitored.

The spectral dependence of the highly stable laser intensity in the presence of evanescent coupling to a sample gas or liquid can be determined by tuning the laser wavelength with current or temperature, by using a sampled grating to increase the tuning range, see S. Kim, "Design and Analysis of Widely Tunable Sampled Grating DFB Laser Diode Integrated With Sampled Grating Distributed Bragg Reflector," *IEEE Phot. Tech. Lett.* 16, 15 (2004), or by placing multiple lasers with slightly different operating wavelengths (e.g., tuned by varying the DFB or DBR grating pitch) on the same chip.

The emitter areas of a sensing chip employing any of these embodiments will be suitable for gold electro-plating above the contact metallization, to enhance the thermal dissipation for better laser and detector performance. In the case of intra-cavity evanescent coupling to the sample gas via an exposed sidewall of the laser ridge, as illustrated in FIG. 3, epitaxial-side-down mounting for further enhancement of the thermal dissipation will be possible only if the processing provides an air pocket that allows the sample gas access to the exposed sidewall of the ridge. Since it may be quite challenging to incorporate such an air pocket, it will be more straightforward to apply epitaxial-side-down mounting to the emitter areas of embodiments that provide evanescent coupling to the sample gas via a passive waveguide section of the laser cavity, as in the embodiments shown in FIGS. 4 and 6.

Figure 7A:
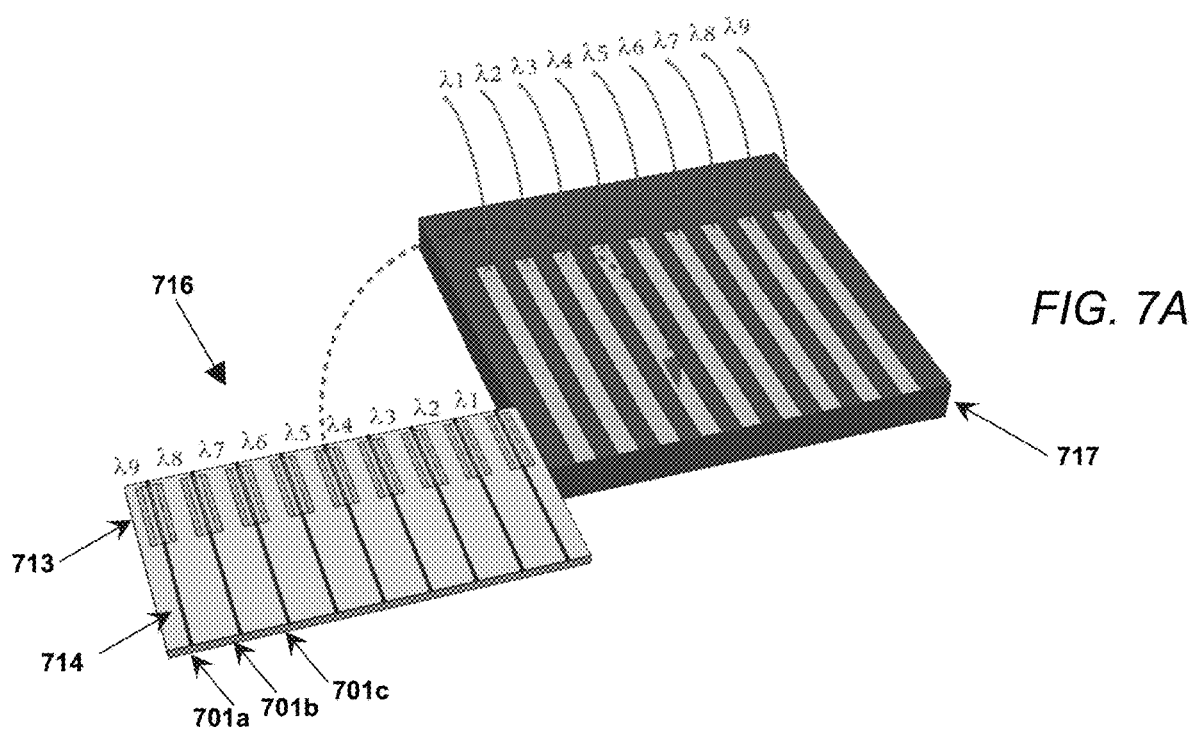
FIGS. 7A and 7B are block schematics illustrating aspects of a chip containing multiple highly stable laser cavities comprising active gain waveguide and passive sensing waveguide sections in accordance with one or more aspects of the present disclosure.
Figure 7B:
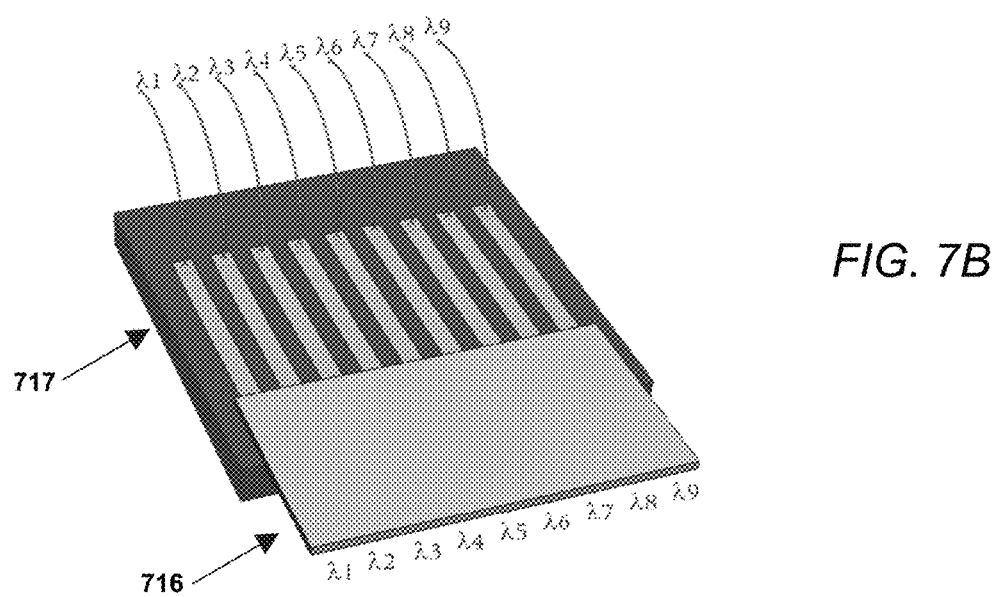

The block schematics in FIGS. 7A and 7B illustrate an exemplary embodiment in which this is accomplished by flip-chip bonding the active gain region of the laser cavity to a heat sink, while leaving the passive sensing waveguide section hanging over the edge of the heat sink to provide access to the sample gas. Thus, FIG. 7A shows a single chip 716 containing multiple highly stable laser cavities 701*a*/ 701*b*, etc, each comprising active gain waveguide and passive sensing waveguide sections 713 and 714, where the chip can be mounted epitaxial-side-down on a patterned heat sink submount 717. After epitaxial-side-down mounting on the patterned submount, as illustrated in FIG. 7B, the passive sensing waveguide sections of all the laser cavities extend over the edge of the submount to provide exposure of the passive sensing waveguide sections to the ambient sample gas.

FIGS. 7A and 7B also illustrate that the active gain waveguide sections of multiple lasers on the same chip can be epitaxial-side-down mounted in this manner, as long as they are all at the same end of the chip and the passive sensing waveguide sections at the other end of the chip can all be exposed over the edge of the mount. It may be more straightforward to mount multiple lasers on the chip epitaxial side down, while another portion of the chip hangs over the edge of the thermal mount to allow access to an ambient sample gas, when both ends of all the laser cavities terminate at the same HR-coated cleaved facet, as will be discussed below.

In some embodiments of the invention, output from the highly-stable laser is coupled into a passive waveguide, e.g., such as that shown in FIG. 5 for the case of an ICL PIC, for chemical sensing or some other functionality elsewhere on the PIC. In some of these embodiments, the mirror at one or both ends of the highly-stable laser cavity is formed by butt-coupling the active and passive waveguides as shown in FIG. 4B. Due to the mismatch of the modal refractive index at the interface between the two waveguide sections, part of the beam is reflected back into the laser cavity to provide feedback.

As discussed above, a dominant contribution to the instability of semiconductor lasers is often unwanted feedback from external optical elements. This effect can be especially strong in the case of a conventional edge-emitting configuration in which the output facet of the cleaved cavity is either AR coated (reflectivity R≤2%) or uncoated (typically R≈25-40%). In both cases, a significant fraction of the light that is returned to the facet following reflection by an external element is transmitted back into the cavity. Therefore, suppressing the feedback from external elements can lead to a substantial enhancement of the laser stability.

One approach to reducing the external feedback is to increase the reflectivity of the output facet to as high as about 90%. In applying this approach as well as the other embodiments discussed below, there is a trade-off between degraded stability when the reflectivity is low against lower maximum output power and efficiency when it is high. A further consideration is that the internal laser operation is more efficient when the mirrors at both ends of the cavity have high reflectivity. The cavity can then be shortened without causing excessive mirror loss, which provides a potential for substantially reducing the threshold drive power. The most straightforward approach to increasing the reflectivity at a facet while still allowing output is to deposit a multi-layer Bragg dielectric coating. However, such coatings can be expensive and challenging to apply, especially at longer wavelengths where each layer becomes proportionally thicker.

An alternative approach to increasing the reflectivity of an output mirror is to use a distributed Bragg reflector (DBR) mirror rather than a cleaved facet to provide reflection at one or both ends of the cavity.

Figure 8A:
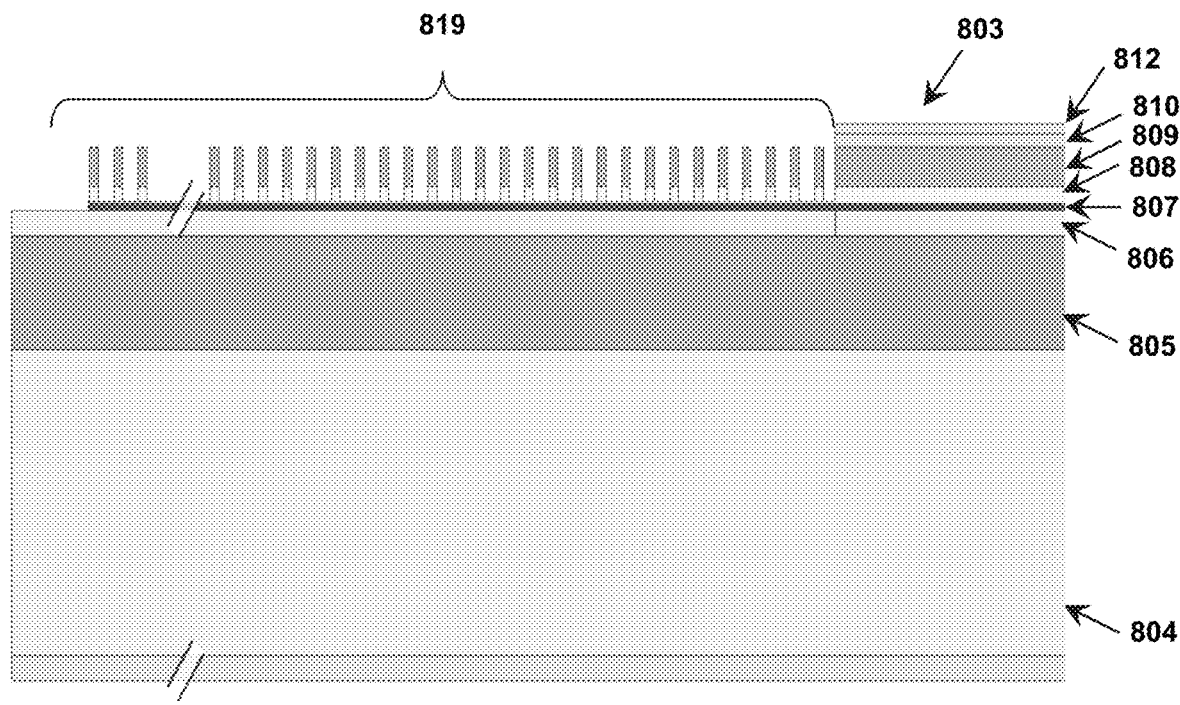
FIGS. 8A and 8B are block schematics illustrating a first- or third-order distributed Bragg reflector (DBR) mirror that can define one end of an ICL cavity in a highly stable laser in accordance with one or more aspects of the present disclosure.

The block schematic in FIG. 8A illustrates an exemplary first- or third-order DBR mirror 819 that defines one end of a highly stable ICL cavity having the layer structure described above with respect to FIG. 2.

In the embodiment illustrated in FIG. 8A, the etch for the DBR preferably stops just above the active ICL gain stages 807, which means that current spreading into those stages can minimize loss in the DBR section of the waveguide that does not have a top contact to provide current injection. Whereas the current injected into a conventional diode laser spreads a few microns at most, it is known that the current injected into an ICL or QCL typically spreads laterally by >100 µm. See Forouhar et al., "Reliable Mid-Infrared Laterally-Coupled Distributed-Feedback Interband Cascade Lasers," *Appl. Phys. Lett.* 105, 051110 (2014); see also U.S. Pat. No. 9,960,571, supra. Due to limitations of the practical etch depth and sidewall angle that can be achieved routinely for a given grating period when GaSb-based laser structures are processed with reactive ion etching, the processing yield is likely to be higher if a third-order grating is employed rather than a first-order grating. For the case of an exemplary ICL emitting at 3.5 µm, the grating period is then roughly 1.5 µm, and it is preferable that the grating comprise >100 periods if high reflectivity is desired. An analogous DBR mirror can similarly be patterned into QCL structures. In the case of a InP- or GaAs-based QCL emitting at a wavelength beyond 4 µm, it may be practical to employ a first-order rather than third-order grating, since those material systems are less challenging to etch with steep sidewall angles, and the period also scales wavelength.

The reflectivity of the DBR mirror can be tuned to a desired value by varying the grating length (number of periods) or the etch depth, to produce the desired trade-off between laser stability and laser power. For maximum reflection by a mirror that is not intended for output, a simulation by the inventors of the ICL structure shown in FIG. 8A indicates that a grating length of at least 100 µm is preferred, which with an etch depth of 1.1 µm is projected to produce a reflectivity of ≈90%. Whereas a longer grating would provide higher reflectivity, there is a limit to how far current injected from the top metal contact will spread into the DBR. Any unpumped outer portion of the DBR that does not receive very much current will be lossy, although this loss will be mitigated somewhat by self-pumping from the laser light reaching those portions of the DBR. Any loss that results will limit the maximum attainable mirror reflectivity. In some embodiments, the etched notches between the DBR teeth can be filled with a dielectric such as SiN, with a metal contact applied to the top of the DBR teeth so that current can be injected into the active stages of the DBR section of the waveguide to minimize the loss. In other embodiments, a dielectric such as SiN can be deposited over the entire top of the DBR, so that metal can be deposited on top of the dielectric for epitaxial-side-down mounting. In any embodiment for which a dielectric fills the notches in the DBR, the grating pitch must naturally be adjusted so as to account for the altered modal refractive index in the DBR section of the waveguide.

When a DBR is used as the output mirror, its reflectivity can be adjusted for optimal trade-off between laser stability and maximum laser power, as discussed above. The beam from an ICL that includes such a DBR can be output to a passive waveguide section that begins just beyond the final DBR period. This passive waveguide can then be directed elsewhere on the chip for use in a PIC, or to an output facet for emission from the chip. In the latter case, feedback from the chip's output facet should be minimized by depositing an AR coating, and possibly also tilting the passive waveguide with respect to the output facet. When the III-V laser is integrated on a silicon PIC platform, it is relatively straightforward to provide a DBR by pre-patterning it into the silicon before the active III-V gain material is bonded and processed. See Spott, *Photonics* 2016, supra.

Figure 8B:
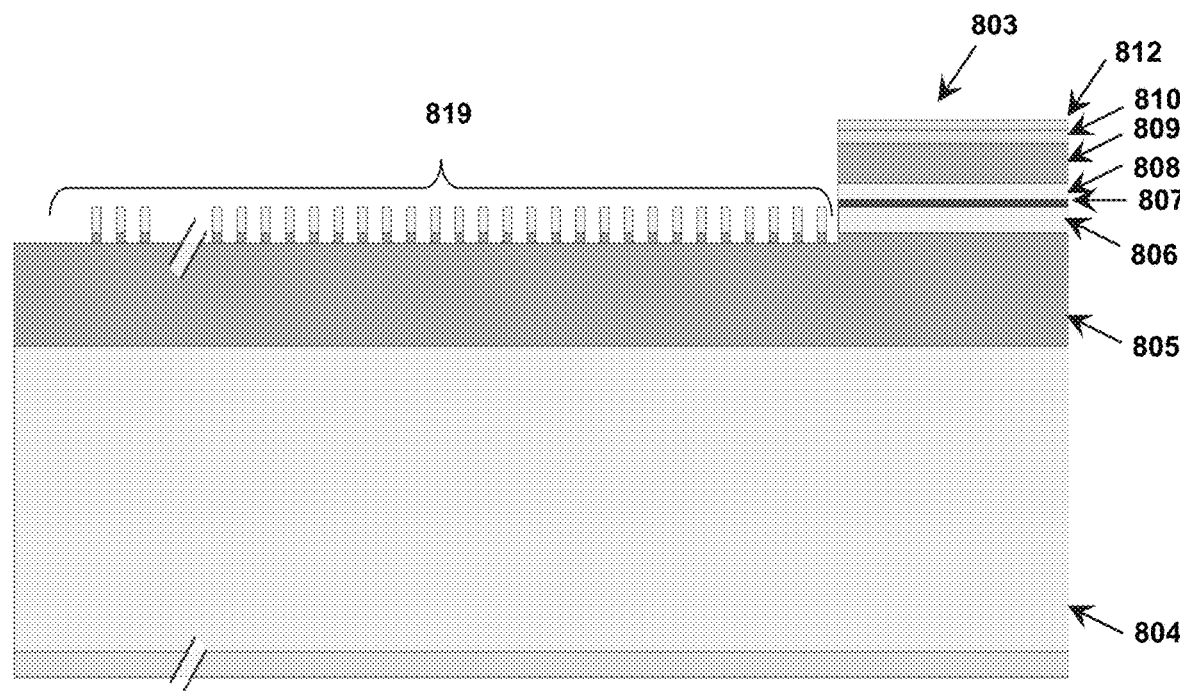

In the embodiment shown in FIG. 8B, the DBR is formed in a passive waveguide structure such as that illustrated in FIG. 5, rather than in the full active waveguide as shown in FIG. 8A. The grating is then etched into the passive waveguide to a depth stopping within the bottom SCL layer 806 or the bottom cladding layer 805. While there will be a greater mismatch of the mode in the laser's narrow ridge waveguide 803 and that in the passive waveguide of the DBR 819, an advantage for some configurations is a lower loss due to removal of the active quantum wells. This may be more important in the case of an ICL rather than QCL PIC, since in the absence of a forward bias the active quantum wells in an ICL display higher optical loss.

In other embodiments of the invention, feedback from optical elements external to the laser cavity (residing either external to the chip or elsewhere on the chip if the laser is integrated into a PIC) is reduced to enhance the laser stability by extracting light via evanescent coupling to a second (passive) waveguide that runs parallel to the primary active gain waveguide over some section of the laser cavity, rather than the conventional extraction of light at a partially-transmissive end mirror (or alternatively, by using a second-order diffraction grating to emit light out of the plane).

Figure 9:
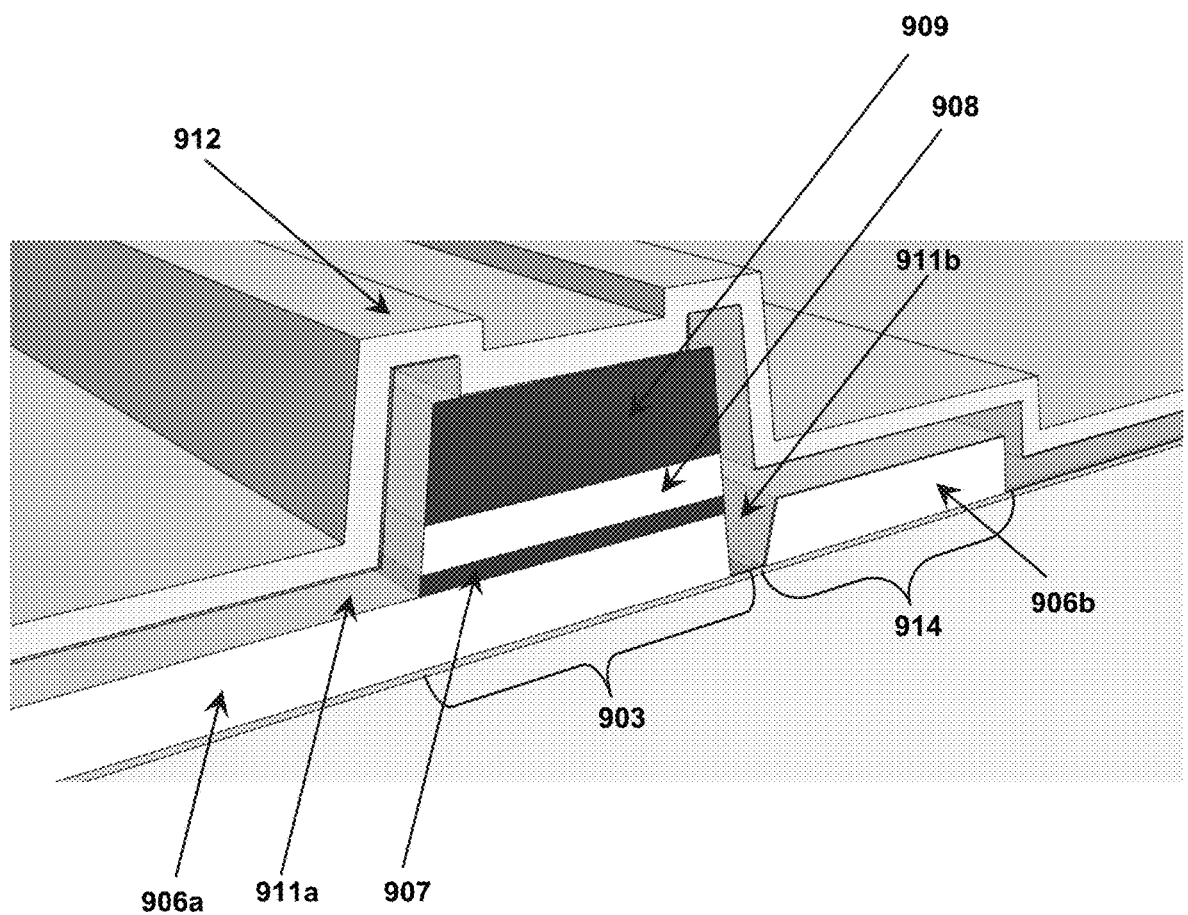
FIG. 9 is a cross-sectional block schematic illustrating aspects of an embodiment of an active waveguide and passive waveguide that can be used in a sensor incorporating a highly stable laser in accordance with one or more aspects of the present disclosure.

The block schematic in FIG. 9 shows a cross-section of one embodiment for the two parallel waveguides at the HR-coated facet. As illustrated in FIG. 9, active gain waveguide 903 includes a bottom SCL section 906a, an insulating film section 911a and top SCL section 908, and further includes active ICL stages 907, top clad 909, and a top n+ contact layer (not shown), whereas passive waveguide 914 includes only a bottom SCL section 906b and dielectric insulating layer 911b on the top and sides without a top clad or active gain stages because those were etched away from the passive waveguide during the processing. Both the active and passive waveguides are coated with a top metal contact layer 912. The preferred separation between the two waveguides is ≈300 nm to ≈2 μm, and the space between them is filled with a layer 911b of a dielectric that has low loss at the emission wavelength, such as SiN in the case of the ICLs. The etch that defines the lateral boundaries of the passive waveguide may proceed through the entire bottom SCL, as shown in FIG. 9 and in FIG. 5A, or it may proceed partway through the bottom SCL as illustrated in FIG. 5B. The entire top of this section of the passive waveguide is covered by the insulating dielectric 911b to minimize loss due to overlap of the optical mode with the top metal 912 that is deposited to provide a top contact and to enhance the extraction of heat from the active laser ridge.

Figure 10:
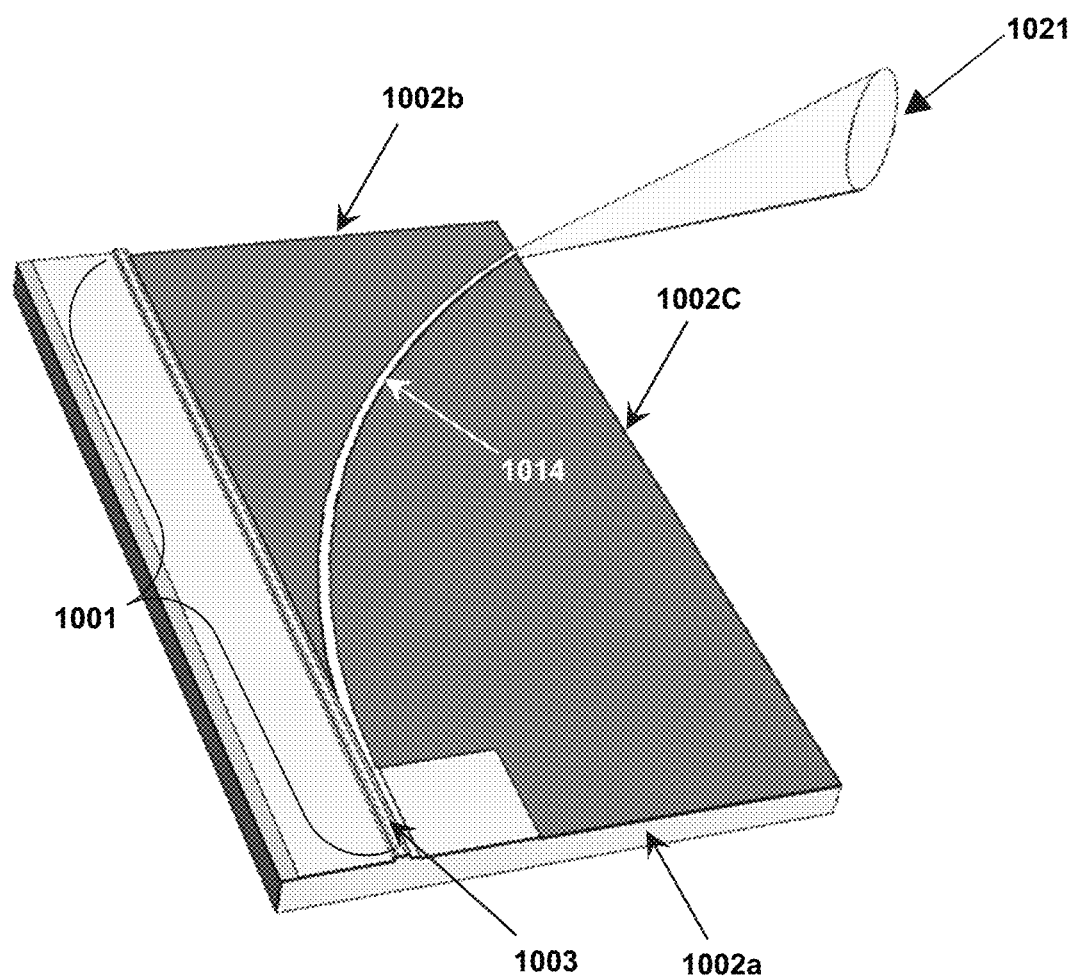
FIG. 10 is a block schematic illustrating an exemplary embodiment of a highly stable laser in accordance with the present disclosure, in which light is extracted from the laser via an active waveguide in combination with a passive waveguide running parallel to the active waveguide over some portion of the laser cavity and in which the laser light is emitted from the chip at the termination of the passive waveguide at a facet.

The block schematic in FIG. 10 illustrates another embodiment of a highly stable laser in accordance with the present invention. In the embodiment illustrated in FIG. 10, light from a laser cavity 1001 is extracted from the highly stable laser via evanescent coupling of the primary (active) narrow ridge waveguide 1003 to a second (passive) waveguide 1014 that runs parallel to the primary (active) narrow ridge waveguide 1003 over some portion of the laser cavity. In the illustrated embodiment, the light coupled into the passive waveguide propagates to a third facet 1002c, which is cleaved orthogonally to the two facets that define opposite ends of the laser cavity, with the light emitted from the chip via the third facet.

Once a desired fraction of the beam has been coupled into the passive waveguide 1014, it angles away from primary active waveguide 1003 and is directed either toward a facet 1002c for emission from the chip as output 1021 (as shown in the FIGURE), or elsewhere on the chip for functionality within a PIC (not shown). In the former case, the facet at which light is emitted may be AR coated, and/or the passive waveguide may intersect the facet at a sufficiently large angle with respect to normal, as shown in the figure, that reflection at the emission facet is minimized. Reflection at the emission facet 1002c would reduce the output power, and also couple reflected light back into the laser cavity 1001.

To provide single-mode operation of the highly stable laser, in some embodiments, a DFB grating may be fabricated in the active waveguide of the laser cavity, while in other embodiments, the cavity may be bounded by high-reflectivity DBRs rather than HR-coated facets.

In still other embodiments, the highly stable laser may also be configured as an interband cascade laser (ICL) frequency comb. See Bagheri et al., "Passively mode-locked interband cascade optical frequency combs," *Sci. Reports* 8, 3322 (2018), which was co-authored by some of the inventors of the present invention. In such embodiments, the laser cavity is divided into two separately-contacted sections, where one section provides gain while the other serves as a saturable absorber (SA). The SA section may be ion bombarded to shorten the carrier lifetime for faster recovery of the absorption condition, and a reverse bias may also be applied to further shorten the lifetime. That configuration can provide passive mode locking, with emission in a pulse length shorter than 1 picosecond.

Figure 11:
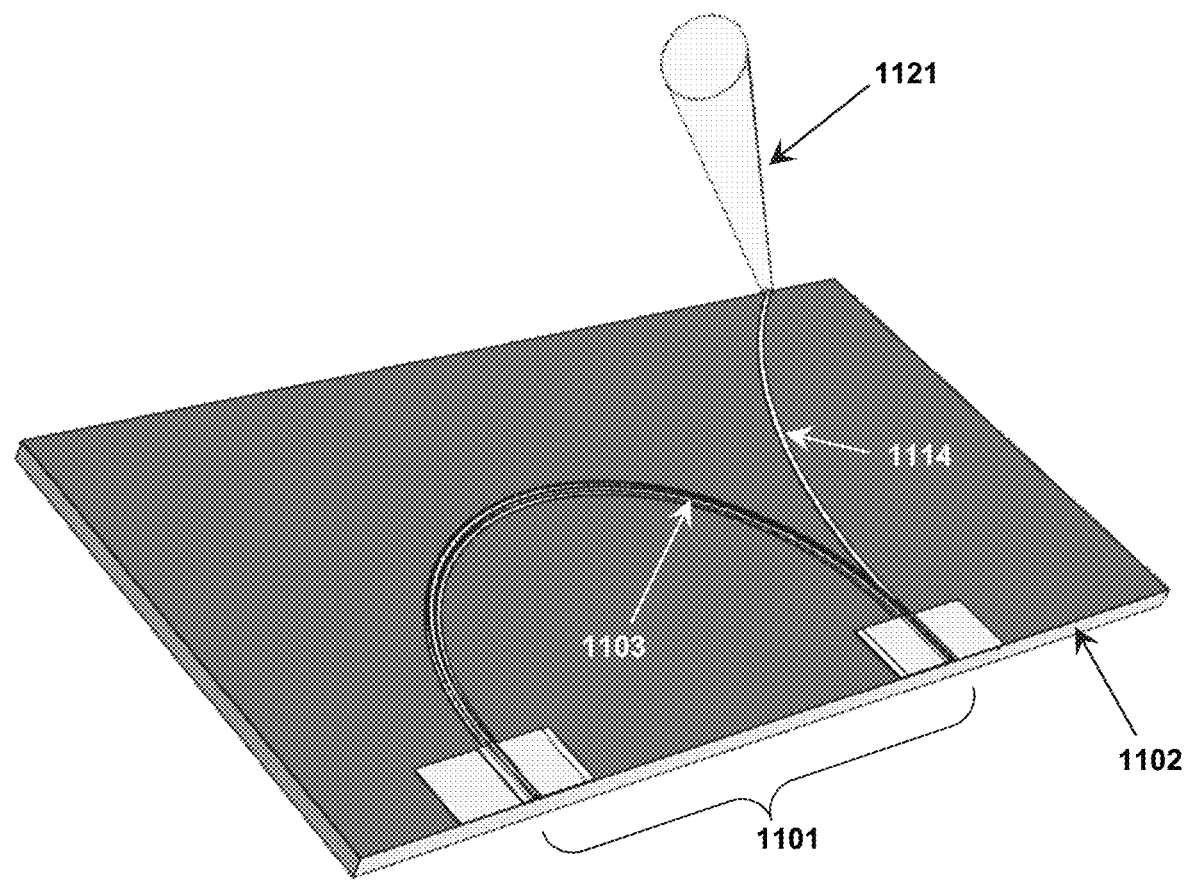
FIG. 11 is a block schematic illustrating another exemplary embodiment of a highly stable laser in accordance with the present disclosure, in which light is extracted from the laser via an active waveguide in combination with a passive waveguide running parallel to the active waveguide over some portion of the laser cavity and in which both ends of the laser cavity terminate at the same HR-coated facet.

The block schematic in FIG. 11 illustrates an alternative embodiment of a highly stable laser in which light is extracted via evanescent coupling to a second (passive) waveguide 1114 that runs parallel to the primary (active) narrow ridge waveguide 1103 over some section of the laser cavity. In this embodiment, the mirrors defining both ends of the laser cavity are provided by the same HR-coated cleaved facet. Apart from the paths followed, the geometries of the active and passive waveguides may be the same as for the embodiment illustrated in FIG. 10. In embodiments for which the mirrors defining both ends of the laser cavity are provided by the same HR-coated cleaved facet, as in FIG. 11, the bending radius should preferably be large enough that bending loss remains a small fraction of the net waveguide loss. Again, the etch that defines the lateral boundaries of the passive waveguide may proceed through the entire bottom SCL, or it may proceed partway through the bottom SCL.

The active waveguide that forms the cavity of the highly stable laser may be straight, and connect two HR-coated cleaved facets, as shown in FIG. 10, or it may be curved such that both end mirrors are provided by the same HR-coated cleaved facet, as shown in FIG. 11. In both cases, gold electroplating may be applied to the active waveguide to improve heat dissipation, which optionally may be followed by epitaxial-side-down mounting to a substrate or other mount. In addition, in both cases, the output beam propagating in the passive waveguide can be directed to a facet for emission from the chip as output 1021/1121, as shown in the FIGURES, or it may be directed to some other region of a PIC for on-chip chemical sensing or some other function. Although FIGS. 10 and 11 show the output waveguide that evanescently couples to the primary waveguide of the laser cavity to be a passive waveguide, in other cases, the output waveguide may be an active waveguide that maintains the active gain stages, top SCL, top clad, and top contact layer.

In the case of a highly stable QCL, the loss in the full gain region without a bias is relatively low, so the passive waveguide may optionally comprise the entire QCL structure with the same processing, ridge width, and etch depth(s) used to form the narrow ridge of the passive waveguide as was used to form the narrow ridge of the active waveguide, except that no dielectric is needed on the sidewalls, no metal is deposited on top for contacting, and no bias is applied. The loss in the passive QCL waveguide may be reduced further by ion bombardment. See U.S. Pat. No. 9,450,053 to Anish Goyal et al., entitled "Photonic Integrated Circuits Based On Quantum Cascade Structures." However, in the case of a highly stable ICL, the loss in the output waveguide will be quite high if the entire ICL gain structure is retained. Therefore, the active stages should be etched away as discussed above to form a low-loss passive waveguide such as those shown in FIG. 5A or FIG. 5B, or the entire ICL structure should be retained, including a top contact which provides a forward bias at a level high enough to reduce the loss to an acceptable level. Alternatively, an output waveguide comprising the full QCL or ICL structure can be contacted and biased above threshold to provide further amplification of the laser signal.

The strength of coupling between the primary and secondary waveguides may be tuned by varying the separation distance between the two waveguides, the depth of the etch in the region separating them, and/or the length over which they run in parallel. A broad range of net coupling strengths can be induced by varying one or more of these design parameters. The net coupling strength will govern the trade-off between laser stability (maximized when the coupling is weak) and maximum output power and efficiency (maximized when the coupling is strong). The maximum coupling is obtained when the region separating the active and passive waveguides is not etched at all. The inventors have simulated the coupling between active and passive waveguides, similar to those illustrated in FIGS. 2 and 5A, respectively, corresponding to a typical design for an ICL emitting at a wavelength around 3.5 µm. If both waveguides are 5 µm wide and separated by 500 nm, with no etch of the region separating them, the simulation predicts that a maximum of ≈27% of the light can be transferred from the active to the passive waveguide, which occurs over a coupling length of ≈19 µm along the longitudinal axis.

In other embodiments, a highly stable laser may generate gain in a hybrid III-V/silicon waveguide processed on a silicon platform.

Figure 12A:
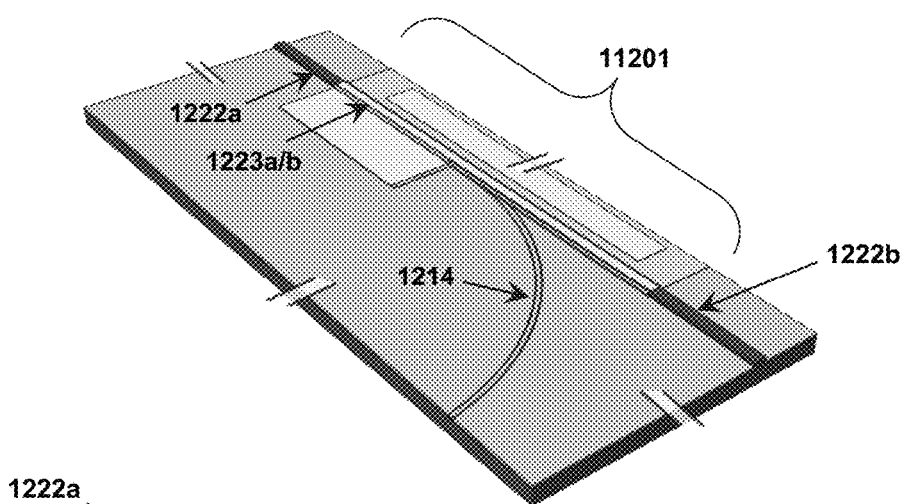
FIGS. 12A-12C are block schematics illustrating an exemplary embodiment of a highly-stable laser on a silicon PIC that is output into a passive waveguide in accordance with one or more aspects of the present disclosure, in which both ends of the laser cavity are terminated by DBR mirrors.
Figure 12B:
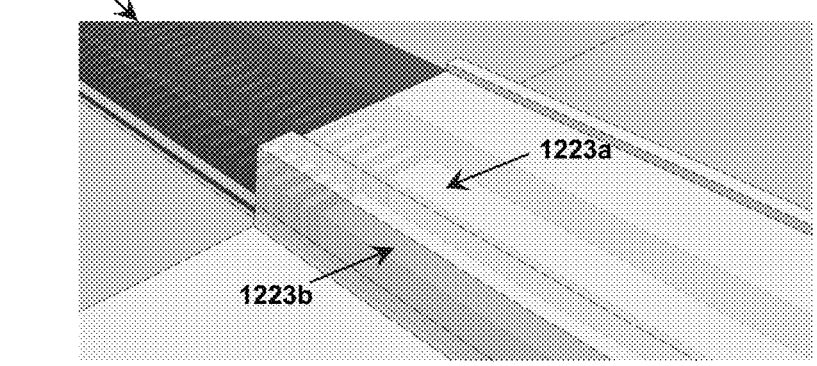
Figure 12C:
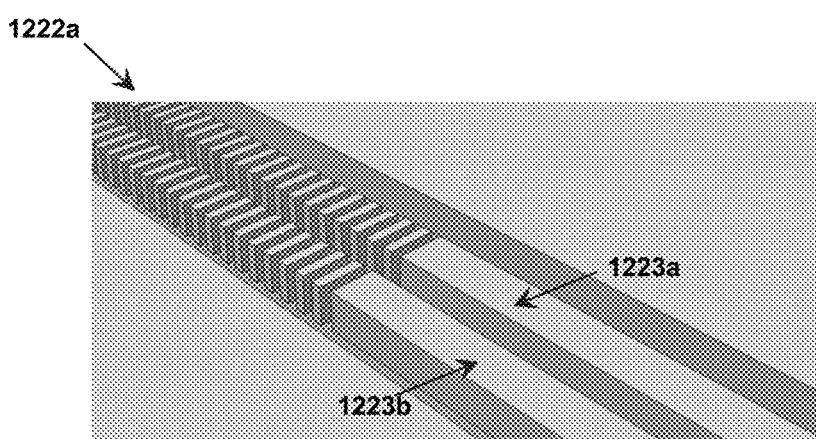

The block schematic in FIGS. 12A-12C illustrates an exemplary embodiment of a coupling approach that is projected to transfer the beam more efficiently while maintaining highly stable laser operation. In the embodiment illustrated in FIG. 12, QCL or ICL gain material is heterogeneously bonded to a pre-processed silicon platform to form a laser cavity with a hybrid narrow-ridge waveguide. See Spott, *Optica* 2016, supra. Preferably, both ends of the laser cavity are bounded by high-reflectivity mirrors. In some embodiments, one or both high-reflectivity mirrors may be an HR-coated facet. In other embodiments, such as that shown in FIG. 12, the III-V ridge extends beyond both ends of the laser cavity, which is bounded and defined by two DBR mirrors 1222a and 1222b which are patterned into the silicon before the III-V gain material is bonded thereto, where the DBR mirrors preferably induce nearly 100% reflectivity in the laser cavity.

The lasing mode resides primarily in a first III-V/silicon hybrid waveguide 1223a, whose silicon portion is a narrow ridge that was pre-patterned in the silicon platform before the two materials were heterogeneously bonded. Following the heterogeneous bonding, the narrow silicon ridge lies underneath the III-V ridge. It is narrower than the III-V ridge, and extends along the entire laser cavity (and beyond) along a straight path. In addition, a second pre-processed silicon waveguide 1223b, which is also narrower than the III-V ridge is laterally separated from the first narrow silicon ridge by some distance and runs parallel to the first silicon waveguide 1223a along some portion of the laser cavity, but at some point begins to follow an angular trajectory that finally exits the III-V mesa and the laser cavity. The second silicon waveguide 1223b extends well beyond the DBR mirror 1222a at a first end of the gain cavity to provide loss outside the gain cavity without inducing any parasitic reflections that can feed light back into the laser cavity. Once it has completely emerged from the III-V mesa, the second silicon waveguide 1223b is a passive waveguide that provides the output of light from the integrated QCL or ICL in the form of a passive waveguide 1214. The output light can either be emitted from the chip, or directed elsewhere on the chip for functionality in a PIC.

This structure also avoids many of the processing challenges that occur when tapers are introduced to transfer the mode between active and passive waveguides, as well as optical losses that can occur at the tapers. Furthermore, highly reflecting DBRs are straightforward to pattern in the silicon waveguide before the III-V gain material is bonded.

As in some of the embodiments discussed previously, there will be a trade-off between higher laser stability when the coupling to the emission silicon waveguide is weak, and higher power transferred to that waveguide when it is stronger. The coupling strength of the emission silicon waveguide to the lasing mode can be controlled by how close its straight portion (to the left in FIG. 12A) is to the center of the optical mode profile that nominally corresponds to the middle of the III-V active mesa, as well by the length of the straight section. This straight portion precedes its angular section that leads to its departure from the laser cavity.

In some embodiments, silicon waveguide 1223a may be eliminated, with the optical mode at the end of the cavity that does not include the second silicon waveguide 1223b (to the right in FIG. 12A) residing almost entirely in the active III-V gain material which is bounded below by air (or a dielectric). Note that this and related embodiments may provide efficient out-coupling for both QCLs and ICLs that are heterogeneously integrated with silicon.

In some embodiments of the invention, an on-chip chemical sensor is formed by coupling the highly stable laser to a sensing region that is not incorporated within the laser cavity as in the embodiments illustrated in FIGS. 4 and 6.

Figure 13A:
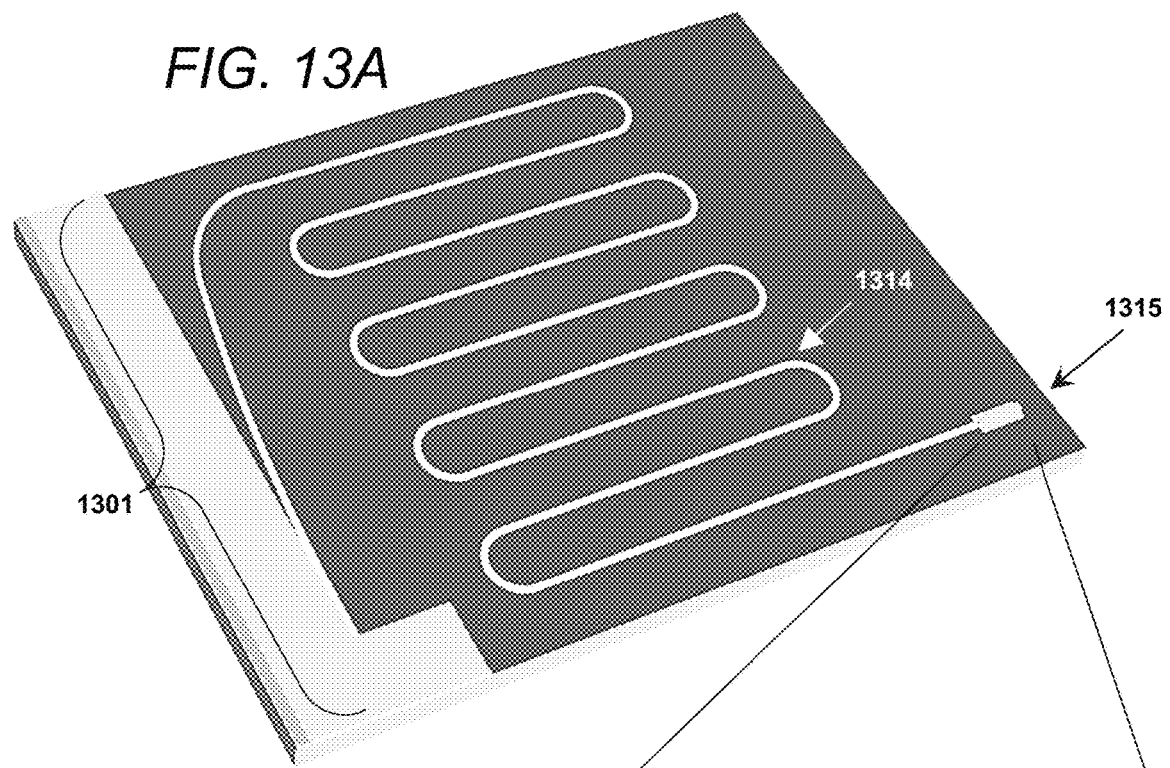
FIGS. 13A and 13B are block schematics illustrating aspects of an exemplary embodiment of a sensor apparatus in which a highly stable laser, a passive waveguide, and an active waveguide are situated on a single III-V semiconductor chip.
Figure 13B:
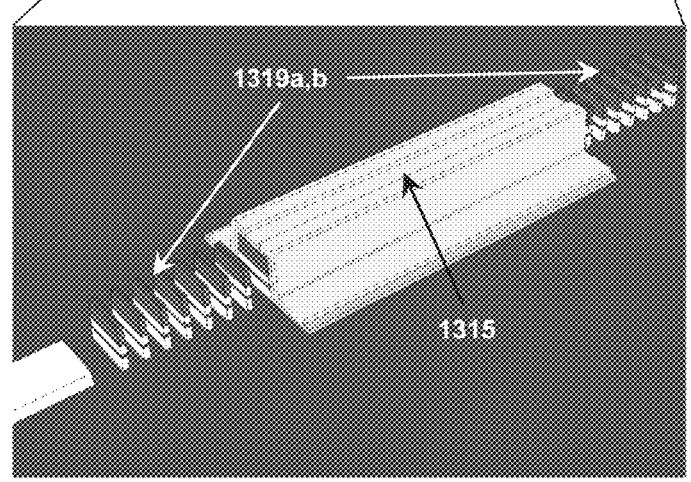

In the subset of embodiments illustrated in FIG. 13A, a portion of the lasing mode is evanescently coupled into a passive waveguide 1314 as discussed above with respect to FIG. 10. Some section of the passive waveguide 1314 has an air top cladding, as in the configurations illustrated in FIGS. 5A and 5B, so as to provide evanescent coupling to an ambient sample gas or liquid. The other end of the passive waveguide then couples to a detector waveguide section 1315 that also resides on the chip. The detector may be processed to have the same narrow ridge active waveguide or a similar active waveguide to the narrow ridge waveguide used in the highly-stable laser cavity. As discussed above and as shown in FIG. 13B, the detector waveguide may optionally be bounded by DBRs that cause it to function as an RCID with increased sensitivity within the linewidth of the spectral resonance. Like the narrow ridge waveguide in the laser cavity, the detector waveguide has a top electrical contact that is used to detect a photocurrent due to light propagating in the detector waveguide when it is operated at zero bias, under a reverse bias, or under a forward bias below that required to reach the lasing threshold.

In the case of a III-V PIC, an interband cascade detector (ICD) or quantum cascade detector (QCD) may be formed from the same active structure as the ICL or QCL source, as illustrated schematically in FIG. 13A and as discussed above regarding the embodiment illustrated in FIG. 6. Alternatively, if the PIC resides on a silicon substrate, the III-V laser and detector structures bonded to the silicon chip may be the same or different.

The block schematic in FIG. 13A illustrates an exemplary embodiment of a sensor in which a highly stable laser 1301 in accordance with the present invention, an extended passive sensing waveguide 1314, and an ICD/QCD 1315 all reside on the same III-V chip. In III-V PIC embodiments such as that illustrated in FIG. 13A, the passive waveguide 1314 that provides sensing may be extended to whatever length optimizes the sensitivity of the response of the ICD/QCD 1315 to the presence of the sample gas or liquid impinging on the sensor. The path followed by the waveguide in the sensing region can be straight or, as illustrated in the FIGURE, can be circuitous, so long as the path's minimum curvature does not induce an excessive bending loss. FIG. 13 B illustrates that in some embodiments, the ICD or QCD 1315 is an in-plane resonant cavity detector that is bounded on both sides by Bragg mirrors 1319 (Meyer et al. '699 patent, supra).

Figure 14:
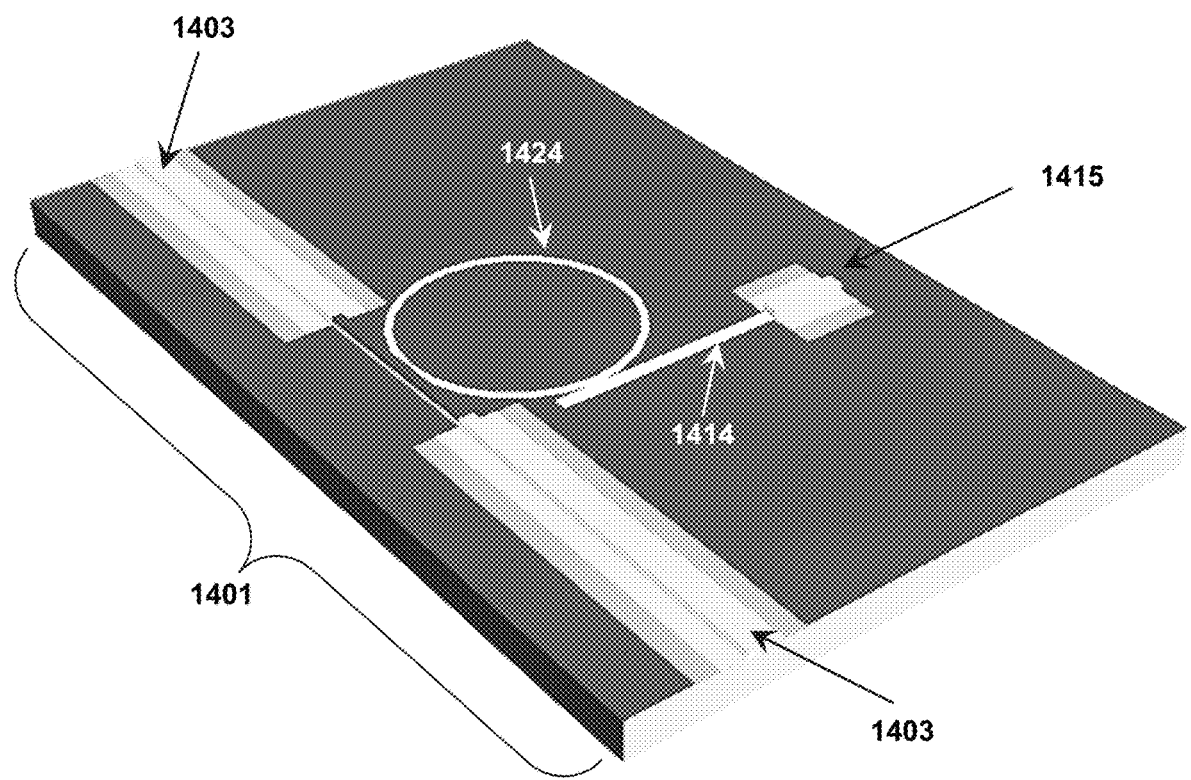
FIG. 14 is a block schematic illustrating another exemplary embodiment of a sensor apparatus in accordance with one or more aspects of the present disclosure, in which the passive waveguide of the sensor region forms a ring resonator.

In other embodiments, such as the embodiment illustrated in FIG. 14, the passive sensing waveguide may take the form of one or more ring resonators 1424 evanescently coupled to the beam propagating in the highly stable laser cavity 1401.

In such embodiments, the highly stable laser beam propagating in the laser cavity couples evanescently to a ring resonator 1424 formed by a passive waveguide whose top and/or sides are exposed to the ambient sample gas or liquid. The intensity of the light propagating in the ring is quantified by evanescently coupling the ring resonator to a waveguide 1414 that leads to a detector 1415 that absorbs the emission wavelength of the laser and resonance wavelength of the ring. As described above, the etch that defines the lateral boundaries of the passive waveguide with respect to the active waveguide may proceed through the entire bottom SCL, as shown in FIG. 5A or it may proceed partway through the bottom SCL as illustrated in FIG. 5B. Naturally, the highly stable laser 1401 must emit at least some light at the resonance wavelength of the ring resonator, and the detector 1415 must be sensitive to light that is incident at that wavelength.

Evanescent coupling of the laser to the ring resonator(s) may be realized by placing one section of the ring waveguide in close proximity to the laser waveguide, or by shaping the ring as a racetrack that evanescently couples to the laser cavity over an extended length. The ring resonator 1424 may have any closed-loop shape that assures low bending loss and a high quality factor Q. Coupling to the ring resonator or to a coupled mode of two ring resonators of slightly different sizes may induce the laser to operate in a single-spectral mode, without requiring the formation of a DFB grating or DBR mirrors. Some of the present inventors previously evanescently coupled ICLs to ring resonators, which was shown to induce laser emission in a single spectral mode. See W. W. Bewley et al., "Single-Mode Interband Cascade Lasers with Coupled Ring Resonators," *Conference on Lasers and Electro-Optics* (2011).

In the embodiment illustrated in FIG. 14, the ring also evanescently couples to a passive waveguide 1414 that leads to a detector 1415 that interrogates the intensity of the optical beam output from the ring resonator. Therefore, measuring the photocurrent flowing in the detector while the resonance wavelength of the ring resonator is varied by temperature tuning or some other means can provide information about the absorption spectrum of the sample gas or liquid. Furthermore, multiple ring resonators with different resonance wavelengths, along with detectors associated with each ring resonator, can provide information over a broader spectral range. If the sample gas contains a chemical species that absorbs light at the ring's resonance wavelength, the output from the ring is reduced by an amount related to the concentration of the absorbing gas species. The net absorption by the gas is enhanced significantly by the many round-trip passes through the high-Q ring cavity. The resonance wavelength of the ring may be tuned to coincide with an absorption feature of a given chemical species by varying the temperature of the sensing area, which in some embodiments may be controlled separately from the temperatures of the source and detector. If no chemical species in the sample gas absorbs at a resonance wavelength within the range that is scanned when the temperature is varied, the detected signal should not vary appreciably with resonance wavelength.

In both of the embodiments illustrated in FIGS. 13 and 14, a passive connecting waveguide, which for an ICL PIC consists only of the core and cladding layers as illustrated in FIG. 5A or FIG. 5B, butt-couples directly to the detector waveguide that contains the full ICD or QCD structure.

If the platform is a III-V PIC, the detector is an ICD or QCD formed from the same wafer material as the laser. In other embodiments, the platform may be formed from a different III-V material if multiple III-V active components are bonded to a common silicon PIC platform for coupling to silicon passive waveguides that form the ring resonator and passive connecting waveguides. Again, the detector may employ an unpatterned active waveguide, or function as an RCID for higher sensitivity if both boundaries of the absorber are bounded by DBRs as in FIG. 13B.

Figure 15A:
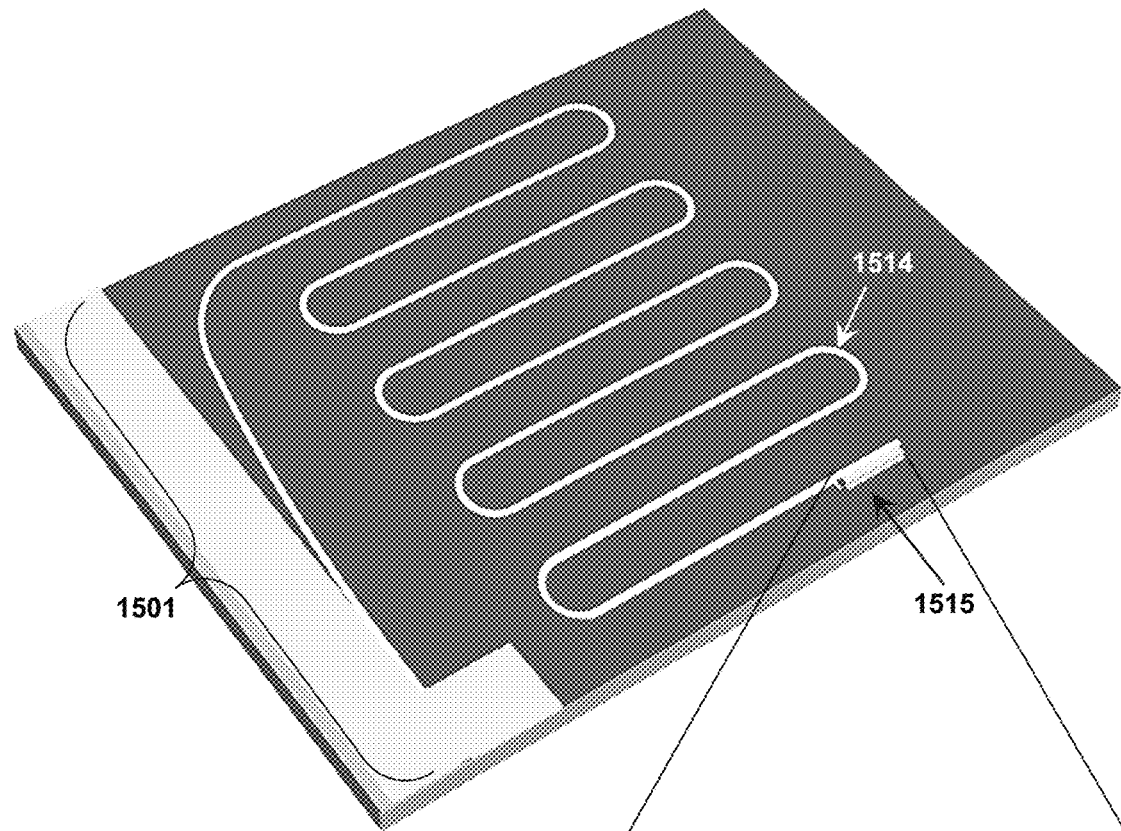
FIGS. 15A and 15B are block schematics illustrating aspects of another exemplary embodiment of a sensor apparatus in accordance with one or more aspects of the present disclosure.
Figure 15B:
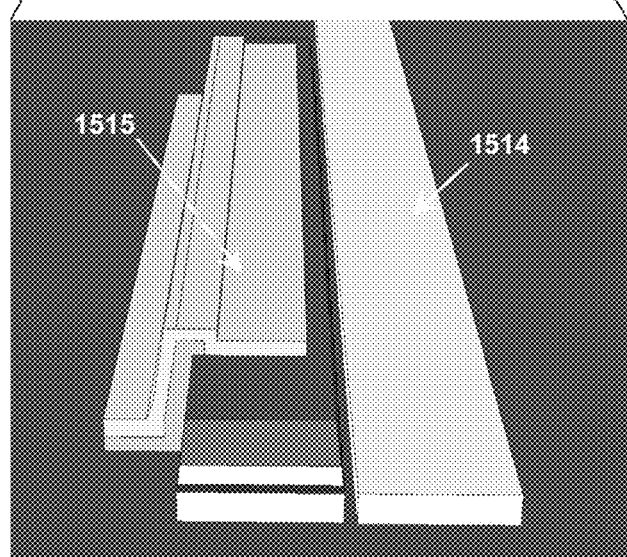

The block schematic in FIG. 15A illustrates an alternative embodiment in which the optical mode propagating in a passive waveguide 1514 evanescently couples to an adjacent detector waveguide 1515, which is also shown in greater detail in FIG. 15B. The geometry of the two waveguides is entirely analogous to the embodiment illustrated in FIGS. 9 and 10, which evanescently couples light propagating in the primary waveguide of a laser cavity to the secondary passive waveguide. In the case of evanescent coupling of the passive waveguide to a detector, the coupling strength should be maximized to the extent possible. With sufficient parallel coupling pathlength, nearly half the light can be transferred to the detector waveguide. In some embodiments, the passive waveguide that runs parallel to the detector waveguide may be bounded by DBRs that maximize the coupling strength for light at the resonant wavelength.

To use the embodiments illustrated in FIGS. 13-15 for on-chip spectroscopic sensing, the laser drive current and/or the temperature of the chip or some portion of the chip may be varied so as to tune the laser wavelength and/or ring resonance wavelength across a narrow fingerprint absorption feature of a given chemical species that may be present in the sample gas. To probe the optical absorption by the sample gas over a broader range of wavelengths, the highly stable laser may be configured as a sampled grating laser whose emission wavelength can be tuned over the entire spectral bandwidth of the gain material. See Kim et al., supra. A given thermal shift of the refractive index of the gain and/or ring resonator material then induces a larger tuning range than can be obtained by tuning a single optical mode.

In other embodiments, current may be injected into the emitter waveguide at a level below the lasing threshold, so that it functions as a light emitting device (LED) or amplified spontaneous emission (ASE) device with emission extending over a broader spectral band (much broader in the case of the LED). In those embodiments, a ring resonator waveguide that evanescently couples to the sample gas, and/or the resonance wavelength of an RCID formed by placing DBRs at each end of the detector's absorber waveguide, may filter the broadband output of the emitter to allow the spectral dependence of absorption by the sample gas to be determined on a much finer wavelength scale.

The block schematic in FIG. 16A illustrates an alternative embodiment in which a single LED, ASE, or tunable ICL or QCL source 1625 emits into a passive bus waveguide 1614, and then a series of single or coupled ring resonators 1624a/b/c/d . . . n, each of which is tuned to a different resonance wavelength, evanescently couples to the same passive bus waveguide. The passive waveguides used for the bus, ring resonators, and connectors leading to the detectors may be formed from the lower SCL of the laser structure as shown in FIGS. 5A and 5B.

Each ring in the series selectively extracts its own resonance wavelength from the bus to allow the spectral dependence of the absorption to be determined. Each ring also couples into a passive waveguide 1614/a/b/ . . . , which in turn couples into to a corresponding ICD or QCD 1615a/b/c/d . . . n, whose absorber waveguide section may optionally be bound at both ends by DBRs to form an RCID. This is analogous to an embodiment described by the inventors of the present invention in U.S. Pat. No. 10,333,011 supra except that the '011 patent described an on-chip chemical sensor residing on a silicon platform, with silicon-based passive bus, ring resonator, and connecting waveguides, whereas the on-chip sensor illustrated in FIG. 16 instead incorporates the entire chemical sensing system on a III-V PIC chip.

Figure 17:
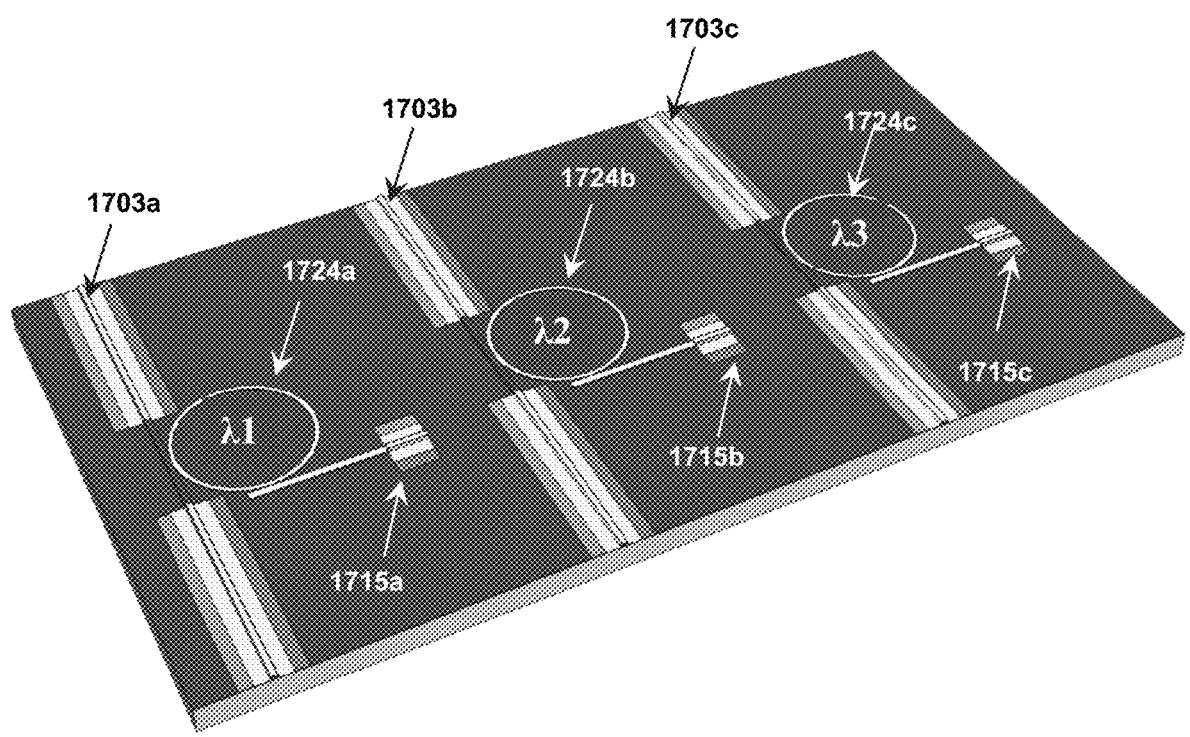
FIG. 17 is a block schematic illustrating another exemplary embodiment of a sensor apparatus in accordance with one or more aspects of the present disclosure in which different groupings of lasers, sensors, and detectors on the same chip operate at different wavelengths.

In other embodiments of the invention, multiple on-chip sensors, each operating at a different resonance wavelength, are integrated onto the same III-V PIC. The block schematic in FIG. 17 illustrates an embodiment in which each in a series of ring resonators 1724a/b/c . . . (or ring resonator pairs) evanescently couples to its own corresponding highly stable laser or broadband optical source with corresponding narrow-ridge waveguides 1703a/b/c . . . , in a manner analogous to the single-element sensor described above with respect to FIG. 14. Each ring resonator is exposed to the sample gas and couples to an ICD or QCD 1715a/b/c . . . that measures the beam intensity at the resonance wavelength of the given sensing element. Although three sensing elements operating at three different resonance wavelengths $\lambda_1$, $\lambda_2$, and $\lambda_3$ are shown in FIG. 17, any number sensing elements may be integrated on the same chip.

Figure 18:
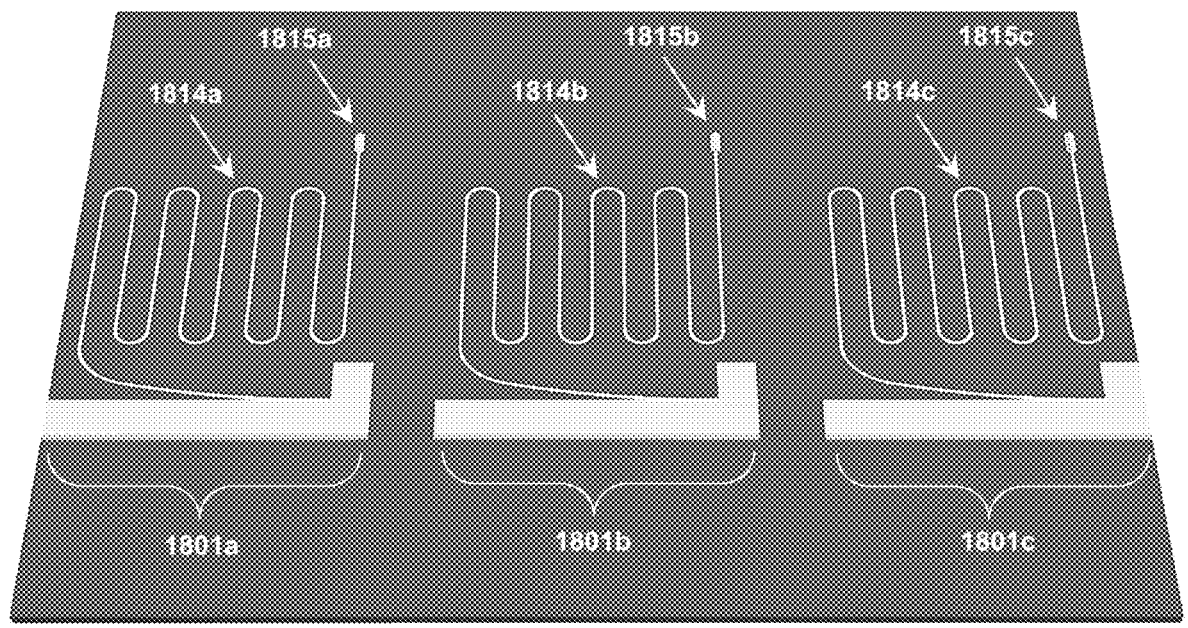
FIG. 18 is a block schematic illustrating an exemplary embodiment of a sensor apparatus in accordance with one or more aspects of the present disclosure.

The block schematic in FIG. 18 illustrates an alternative embodiment in which multiple extended passive sensing waveguides 1814a/b/c reside on the same chip in a manner analogous to the single-element sensor embodiment described above with respect to FIG. 13. In this embodiment, emission from each of an array of highly stable laser cavities 1801a/b/c (or broadband LEDs or ASE sources) is input into a corresponding extended passive waveguide 1814a/b/c, etc., where the passive waveguides have air top claddings that allow evanescent coupling to the sample gas. Corresponding ICDs or QCDs 1815a/b/c that are coupled to each extended passive sensing waveguide 1814a/b/c measure the signal traversing the full length of each such passive waveguide, with each sensing element operating independently of the others. Again, although three independent sensing elements operating at three different wavelengths are illustrated in FIG. 18, any number of sensing elements may be integrated on the same chip.

In this case, spectroscopic information is obtained by varying the DFB or DBR grating period to tune each individual single-spectral-mode laser 1801a/b/c to a different emission wavelength, or by employing broadband sources and varying the resonance wavelength of an RCID 1815/a/b/c that measures the intensity of the optical beam transmitted by the extended passive sensing waveguide. When multiple sensors operating at different resonance wavelengths are employed on the same chip, the different sensors can be tuned to wavelengths on and off the spectral fingerprint features of a given chemical, to several representative wavelengths that provide additional spectral details, or to use the same chip for detecting multiple chemical species. Fine-tuning of the sensing element resonance wavelengths can be implemented by locally or globally controlling the temperature on the chip, or by varying the current injected into each given laser source.

Figure 19:
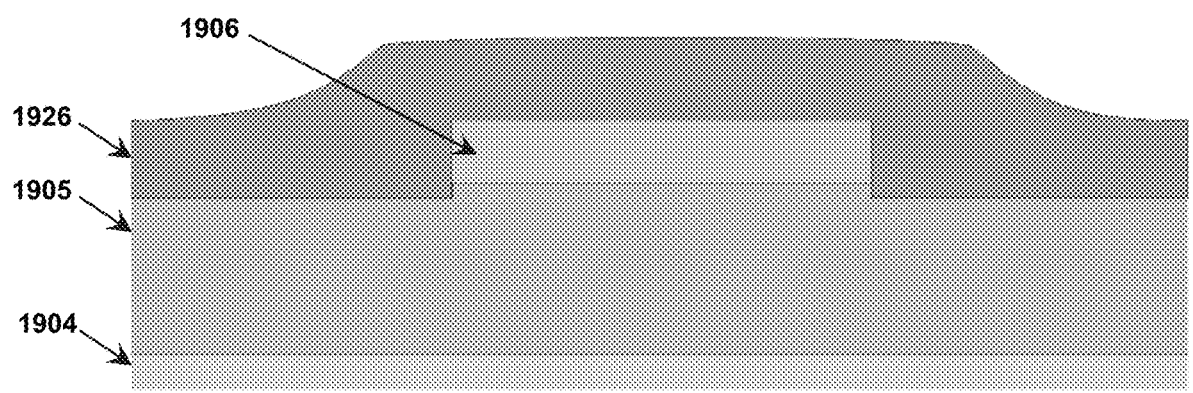
FIG. 19 is a block schematic illustrating an exemplary embodiment of a passive waveguide having a sorbent coating deposited thereon in accordance with one or more aspects of the present disclosure.

The block schematic in FIG. 19 illustrates that in some embodiments, the top of the passive waveguide in the sensing region can be coated by a chemical sorbent 1926 which can adsorb the molecules of certain classes of chemicals, thereby placing them in the immediate vicinity of the propagating light beam and enhancing their molecular concentration by orders of magnitude. See, e.g., T. H. Stievater et al., "Micromechanical Photothermal Spectroscopy of Trace Gases Using Functionalized Polymers," *Opt. Lett.* 37, 2328 (2012).

Thus, as shown in FIG. 19, the passive waveguide in such a case can include a GaSb substrate 1904, a n-InAs/AlSb superlattice bottom clad layer 1905, and a bottom GaSb SCL 1906. Sorbent layer 1926 covers all of the SCL 1906 and the upper surface of the bottom clad layer 1905, with the thickness of the sorbent coating preferably matching the vertical extent of the optical mode propagating in the passive waveguide. As in the other cases described herein, the etch that defines the lateral boundaries of the passive waveguide may proceed through the entire bottom SCL, as shown in FIG. 19 and in FIG. 5A or it may proceed only partway through the bottom SCL, as illustrated in FIG. 5B. In addition, although FIG. 19 illustrates a case where the chemical sorbent is deposited on a passive waveguide processed on an ICL chip, in other embodiments the sorbent may be deposited on the passive waveguides on a QCL PIC chip, or on passive silicon waveguides.

As noted above, the cavity of a highly stable ICL may be configured with gain and saturable absorber sections so that it is passively mode locked and produces short pulses that appear as a frequency comb in the spectral domain, as was recently demonstrated in Bagheri et al. supra. Since the comb stability is often a primary factor limiting the detection sensitivity of dual-comb spectroscopy, it will be advantageous to exploit the greater stability provided by the architectural embodiments of the present invention.

Thus, in some embodiments, both end mirrors of the highly stable frequency comb ICL are defined by HR-coated cleaved facets, and the laser output is obtained via evanescent coupling to a secondary passive waveguide. This is directly analogous to the configurations illustrated in FIGS. 9, -11, and 15 for highly stable lasers that are not frequency combs, except that the cavity for the frequency comb laser is divided into gain and saturable absorber sections. As in the case of a highly stable non-frequency-comb laser, the laser cavity in a highly stable frequency-comb laser (ICL or QCL) can also be defined by an etched facet or a DBR mirror at one or both ends of the cavity. The output of such a highly stable frequency comb laser can be emitted from the chip, as illustrated in FIGS. 10 and 11, or it may be directed via the passive waveguide to some other region of the chip for functionality in a PIC as in FIGS. 13 and 15. For example, one or more highly stable frequency comb ICL(s) may be used as the source(s) for an on-chip chemical sensing system.

In particular, two highly stable frequency combs may be employed on the same chip as sources for fully integrated on-chip dual-comb spectroscopy. See, e.g., L. A. Sterczewski et al., "Mid-Infrared Dual-Comb Spectroscopy with Low Drive-Power On-Chip Sources," *Opt. Lett.* 44, 2113 (2019). Dual-comb spectroscopy is known to offer high spectral resolution over a broad spectral bandwidth, combined with a very short acquisition time on the order of milliseconds. See, e.g., G. Villares et al., "Dual-Comb Spectroscopy Based on Quantum-Cascade-Laser Frequency Combs," *Nature Commun.* 5, 6192 (2014). In dual-comb spectroscopy, information about the absorption spectrum of the sample gas is obtained by using a fast detector to observe the multi-heterodyne beating of two frequency combs that have slightly different comb spacings (determined by the cavity length), so as to generate a direct link between the optical and RF domains. The beam from one of the combs interrogates the sample gas, whereas the other comb functions as a local oscillator whose beam does not come into contact with the sample gas. Both transmitted beams then coupled into the same on-chip ICD or QCD, whose output is input to an RF spectrum analyzer. Since a fast detector is required for rapid sensing measurement speed, it is advantageous that both ICDs and QCDs have displayed 3-dB bandwidths of up to 1 GHz and above. See H. Lotfi et al., "High-Frequency Operation of a Mid-Infrared Interband Cascade System at Room Temperature," *Appl. Phys. Lett.* 108, 201101 (2016); and F. R. Giorgetta et al., "Quantum Cascade Detectors," *IEEE J. Quant. Electron.* 1039 (2009).

Figure 20:
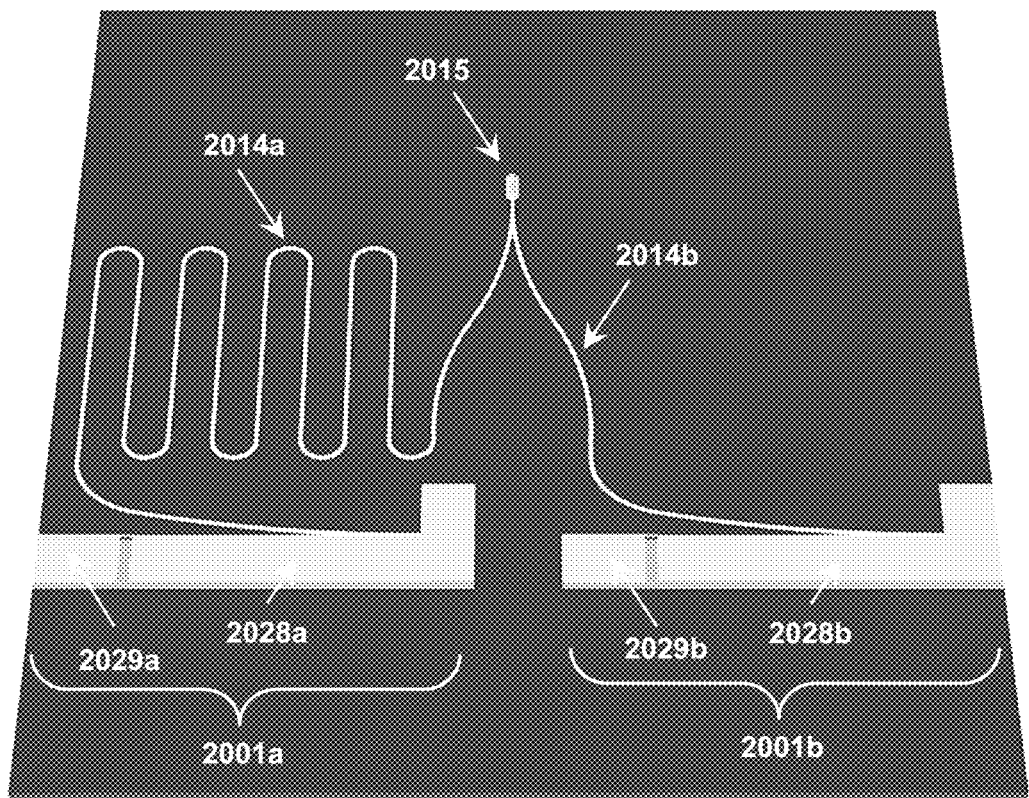
FIG. 20 is a block schematic illustrating an exemplary embodiment of a sensor apparatus in accordance with one or more aspects of the present disclosure in which the outputs from two ICL frequency combs, only one of which is attenuated by passing through a passive waveguide that evanescently couples to a sample gas, are output to the same ICD to provide dual comb spectroscopy.

For the on-chip dual-comb spectroscopy embodiment illustrated in FIG. 20, the laser cavity 2001a/b of each comb is formed from a straight waveguide divided into a gain section 2028a/b and saturable absorber section 2029a/b. As illustrated in FIG. 20, in this embodiment, the two ICL frequency comb lasers with slightly different comb spacings are situated at the same end of the chip to allow both to be mounted epitaxial-side-down, while the extended passive waveguide 2014a of the sensing region hangs over the edge of the mount to provide contact with the ambient sample gas. Both ends of each laser cavity are highly reflective, e.g., from a combination of HR-coated cleaved facets, HR-coated etched facets, and/or DBR mirrors, although this embodiment does not allow either frequency comb laser to be bounded on both sides by HR-coated cleaved facets.

In the embodiment illustrated in FIG. 20, each of the frequency comb lasers 2001a/b (described herein as being ICLs, though QCLs can also be used) evanescently couples to a secondary passive waveguide 2014a/b that runs parallel to the active waveguide over some section of the laser cavity, as described above with respect to FIGS. 9 and 10. However, in other embodiments the output from one or both frequency comb ICLs may couple to its corresponding passive waveguide by butt-coupling the passive waveguide to a DBR mirror that defines the output end of the laser cavity. The output from the first highly stable frequency comb ICL 2001a couples to an extended passive sensing waveguide 2014a, whose top surface is exposed to ambient to allow evanescent coupling of the propagating beam to the ambient sample gas. Absorption by the sample gas then affects the spectral dependence of the light signal reaching the detector following traversal of the extended passive sensing waveguide. The extended passive sensing waveguide, in turn, couples to the input of an on-chip ICD 2015. The output from the second highly stable frequency comb ICL 2001b (the local oscillator) evanescently couples to a second, much shorter passive waveguide 2014b that proceeds directly to the same ICD 2015. The signal transmitted by the second passive waveguide is not affected significantly by exposure to the sample gas, partly due to its much shorter length, and in some embodiments also because the second passive waveguide is encapsulated so as to prevent its propagating optical mode from coupling to the sample gas.

The two passive waveguides shown in this figure are coupled to the same ICD by a Y-Junction, whose single output passive waveguide butt-couples to the ICD.

Figure 21:
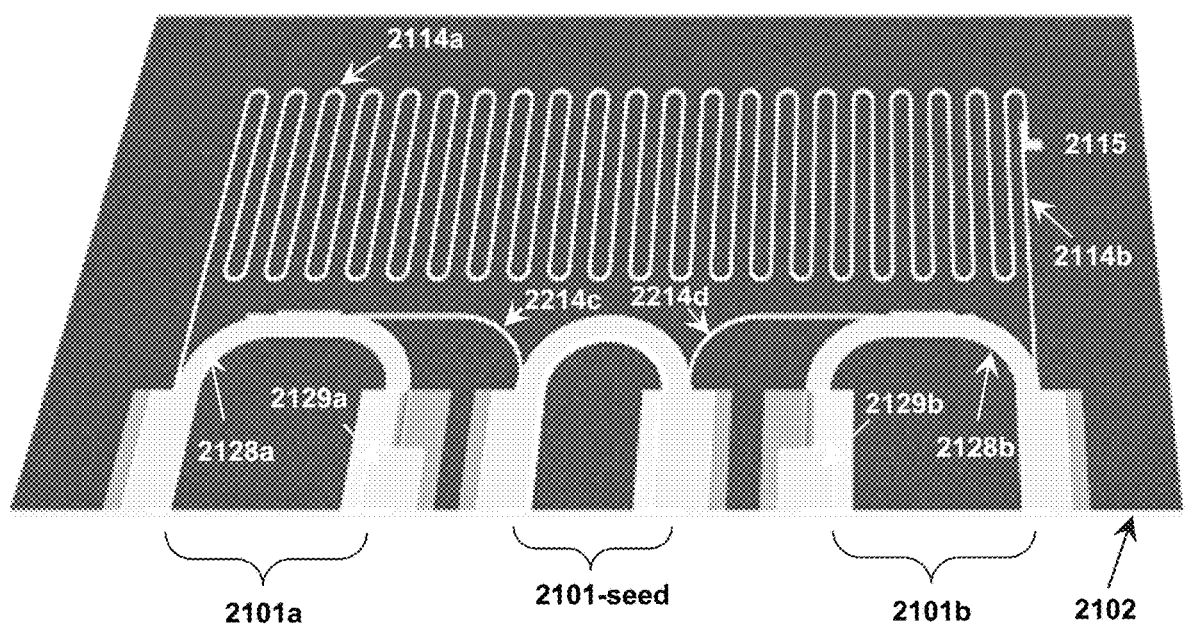
FIG. 21 is a block schematic illustrating an exemplary embodiment of a sensor apparatus in accordance with one or more aspects of the present disclosure, in which two ICL frequency combs are locked by input from the same ICL seed laser.

In an alternative embodiment illustrated in FIG. 21, the input passive waveguides 2114a/b can evanescently couple to the two sides of an ICD or QCD 2115 rather than coupling to the detector via a Y-junction as in the embodiment illustrated in FIG. 20. In still other embodiments, the passive waveguides can be combined by an arrayed waveguide grating (AWG) or some other means known to the art before the combined beams are coupled to the ICD or QCD. The combined photocurrent signal measured by the fast ICD due to both transmitted beams is input to an RF spectrum analyzer that determines the multi-heterodyne beating of the two ICL frequency combs with slightly different comb spacings.

In the embodiment illustrated in FIG. 21, two frequency comb lasers 2101a/b, each having a gain section 2128a/b and a saturable absorber section 2129a/b, and each having a slightly different comb spacing, are used. In this embodiment the cavity for each of the two frequency comb lasers 2101a/b is formed from a waveguide containing curved sections to form a laser cavity terminated at both ends at the same HR-coated cleaved facet 2102, by analogy to the embodiment illustrated in FIG. 11 for a single laser, so that the same HR-coated cleaved facet provides both end mirrors for each of the two highly stable frequency comb lasers 2001a/b. Both lasers can then reside at one end of the chip, while the extended passive sensing waveguide 2114a, the shorter passive waveguide 2114b, and the ICD 2115 can reside at the other end, so as to allow both frequency comb lasers to be mounted epitaxial side down while the extended passive sensing waveguide hangs over the edge of the mount to allow evanescent coupling of its top surface to the ambient sample gas. This configuration has the advantage that the common HR-coated cleaved facet, which provides both end mirrors for both frequency comb lasers, is generally much easier to process with high yield, using standard procedures, than an HR-coated etched mirror or a DBR.

As in the embodiment illustrated in FIG. 20, in this embodiment, the output from the first highly stable frequency comb ICL 2101a couples to an extended passive waveguide 2114a that evanescently couples to the sample gas, followed by input to the ICD 2115. The second highly stable frequency comb ICL 2101b couples to a passive waveguide 2114b that leads directly to the same ICD 2115 without interacting with the sample gas, or its interaction is over a very short path length.

In addition, in the embodiment illustrated in FIG. 21, both passive waveguides 2114a/b run parallel to an active waveguide in the ICD for some distance to allow transfer of the input beams to the detector waveguide. As in the case of embodiments where a single input waveguide couples to the detector evanescently, the embodiment that evanescently couples two input waveguides has the advantage of greater laser stability, because much lower fractions of the incoming beams are reflected back into the passive waveguides for unwanted feedback into the two lasers. However, a Y-Junction (as in FIG. 20) or some other means known to the art may alternatively be used to couple both beams into the same ICD.

In all of the on-chip dual-comb sensing embodiments, such as those illustrated in FIGS. 20 and 21, the extended waveguide that provides evanescent coupling to the sample gas can be coated with a chemical sorbent that concentrates the molecules of interest so as to substantially increase the absorption due to those molecules.

In the embodiment illustrated in FIG. 21, a DFB ICL seed laser 2101-seed provides input to both combs, via passive waveguides 2101c/d, to lock the frequencies of two frequency combs. The DFB ICL that resides between the two combs operates in a single spectral mode that is preferably near the center of the gain spectra of the two ICL frequency comb lasers 2101a/b that reside on each side of the DFB laser 2101-seed. The incorporation of a seed laser such as that shown in FIG. 21 is optional for operation of the on-chip dual-comb spectroscopy system of the invention.

Figure 22:
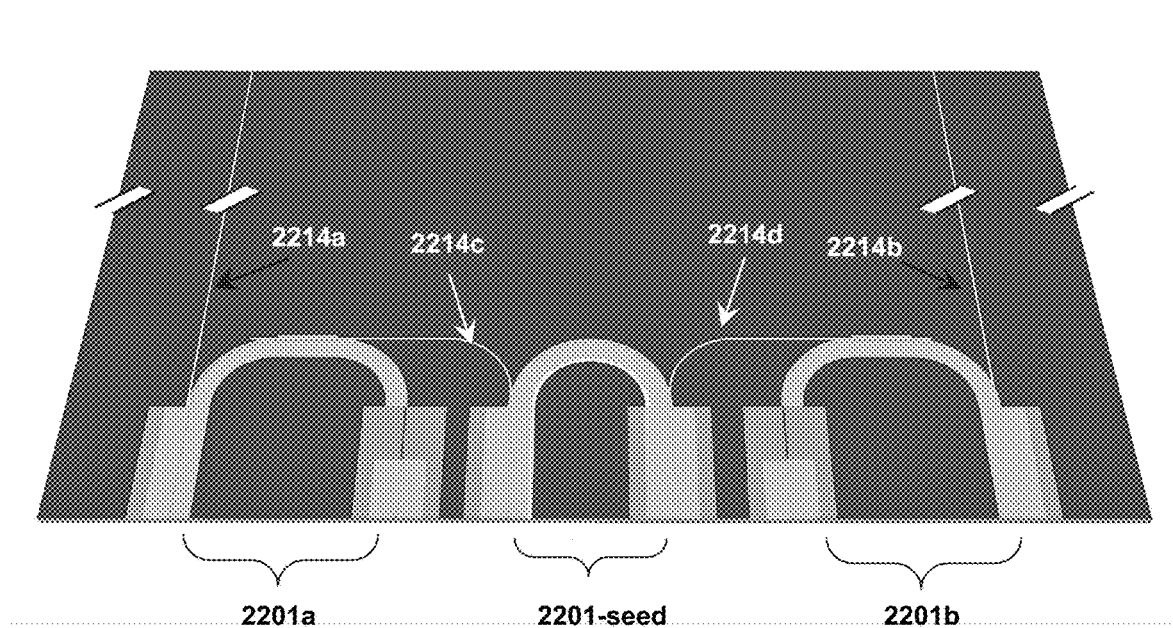
FIG. 22 is a block schematic illustrating an exemplary embodiment of a sensor apparatus in accordance with one or more aspects of the present disclosure.

The block schematic in FIG. 22 illustrates an exemplary PIC embodiment that employs a DFB ICL seed laser 2201-seed to lock the frequencies of two frequency combs. The DFB ICL that resides between the two combs operates in a single spectral mode that is preferably near the center of the gain spectra of the two ICL frequency comb lasers 2001a/b that reside on each side of the DFB laser 2201-seed. In the embodiment illustrated in FIG. 22, similar to the manner described above with respect to FIG. 21, both end mirrors for all three lasers are provided by the same HR-coated cleaved facet, although numerous other geometries are possible while maintaining the same inventive design aspects, such as bounding one or both ends of one or more of the laser cavities by DBR or etched mirrors. In the embodiment illustrated in FIG. 22, two passive waveguides 2214a and 2214b are evanescently coupled to the active waveguide of the DFB ICL at each end of its cavity. Each of those passive waveguides 2114a/b then couples light from the DFB ICL to each of the frequency comb ICLs 2001a/b, which may have the effect of locking them to the DFB emission wavelength, provided that wavelength is sufficiently close to one of the teeth of the frequency combs. The two comb outputs may either be emitted from the chip, e.g., at one of the end facets, or be evanescently coupled into output waveguides 2214a/b to be used elsewhere on the chip for functionality in a III-V or silicon PIC.

Figure 23:
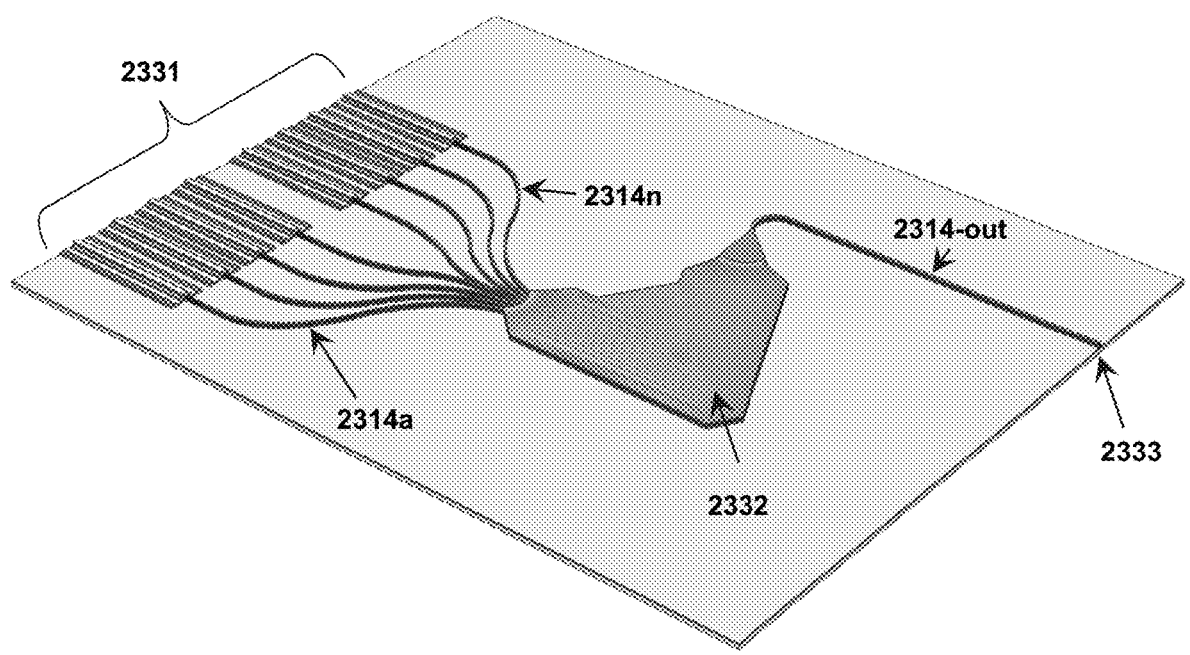
FIG. 23 is a block schematic illustrating an exemplary embodiment of a sensor apparatus in accordance with one or more aspects of the present disclosure, in which outputs from an ICL or QCL array are input to an arrayed waveguide grating (AWG) that spectrally combines them for output into a single passive waveguide.

Other embodiments of III-V PICs designed in accordance with the invention may provide on-chip spectral beam combining to scale the laser power that can be output into a single high-quality beam, as illustrated by the block schematic in FIG. 23. In this embodiment, a QCL or ICL array 2331 of DFB or DBR lasers is patterned to have slightly different grating pitches so that each laser emits at a slightly different wavelength. The outputs from the lasers in the array can be butt-coupled to passive waveguides 2314a/b/ . . . designed and processed in accordance with the invention (e.g., as described above with respect to FIG. 5A or FIG. 5B in the case of an ICL), with partially-reflecting DBRs. In other embodiments, the refractive index mismatch at the interface between the active and passive waveguides, as shown in FIG. 4B, defines one end mirror for each laser cavity. The outputs from the various array elements emitting at different wavelengths may then be input to an AWG 2332 for spectral beam combining into a single output waveguide 2314-out. The array output with much higher power than each individual array element is then emitted from the chip at a single waveguide aperture 2333. Processing protocols for mounting such an array epitaxial side down are well known to the art.

Figure 24A:
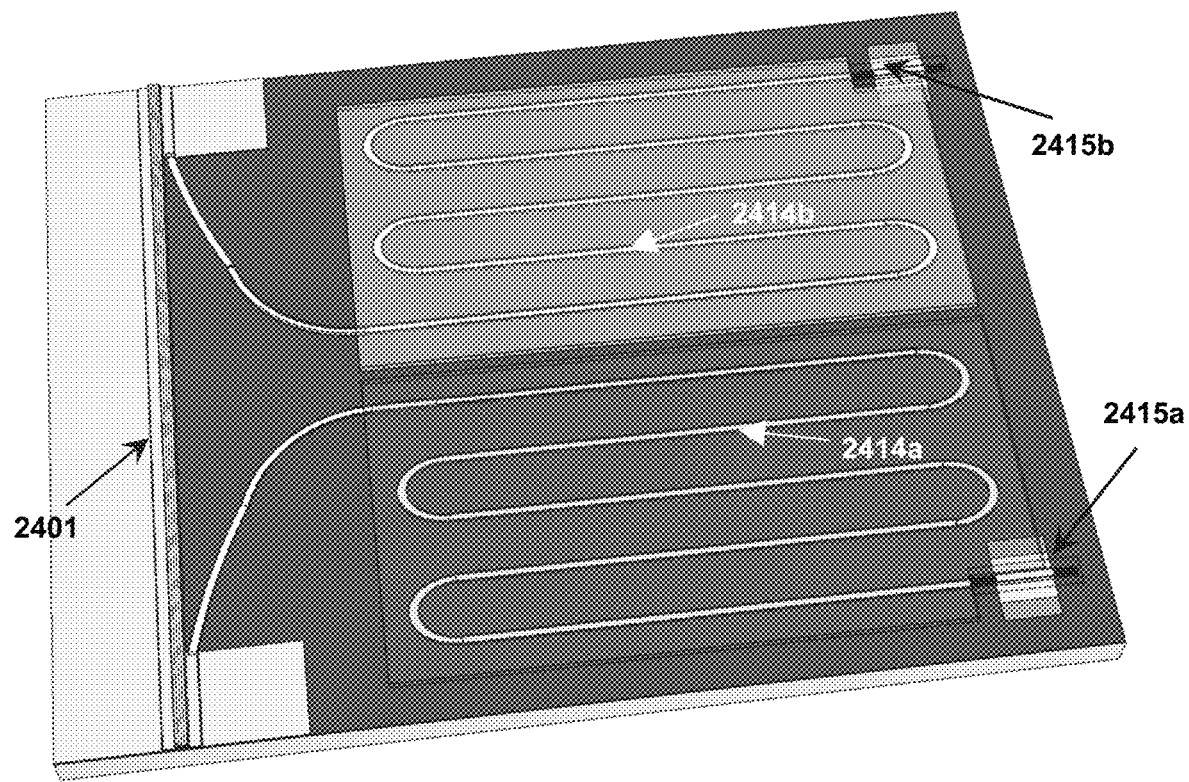
FIGS. 24A-24C are block schematics illustrating a further exemplary embodiment of a sensor apparatus in accordance with one or more aspects of the present disclosure, in which a highly-stable laser cavity evanescently couples to two different passive waveguides, one of which is exposed to the sample gas while the other provides a reference signal.
Figure 24B:
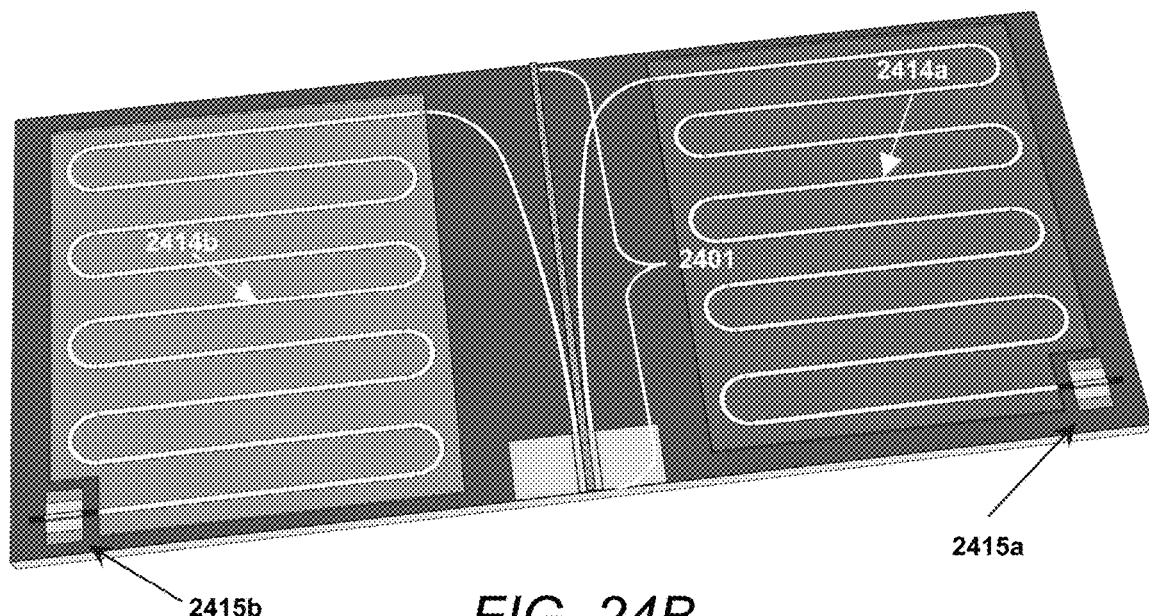
Figure 24C:
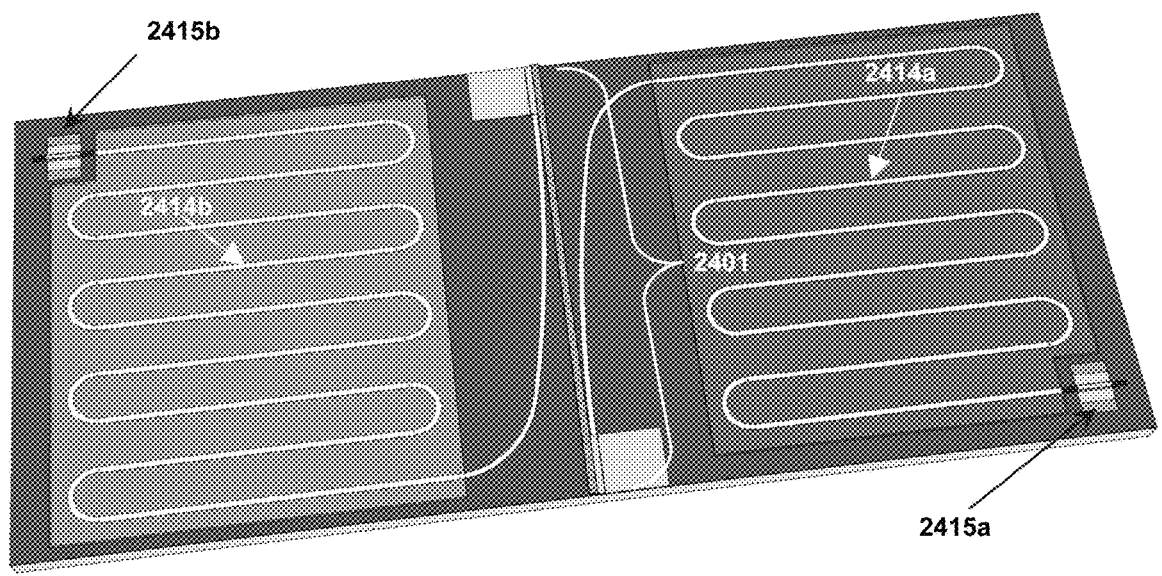

In some embodiments, the same highly-stable laser cavity evanescently couples to two different passive waveguides. In the embodiment shown in FIG. 24A, the two passive waveguides 2414a/b run in parallel to the laser cavity 2401 for evanescent coupling on the same side of the laser ridge but at opposite ends of the cavity. Alternatively, for the embodiment illustrated in FIG. 24B the two passive waveguides couple to opposite sides of the laser ridge at the same end of the cavity, while in the embodiment shown in FIG. 24C the two passive waveguides couple to opposite sides of the laser ridge at opposite ends of the cavity.

In all of these embodiments, both passive waveguides have the same extended length with the same shape, and at the opposite end both couple to ICDs or QCDs integrated on the chip. However, one extended passive waveguide is exposed to the sample gas while the other serves as a reference because it is not exposed. For example, exposure of the reference extended waveguide to the sample gas can be prevented by encapsulating that portion of the chip in a hermetic dome that the sample gas does not penetrate.

All of these embodiments have the advantage of providing a reference signal that propagates through the same length and shape of waveguide for detection by an identical ICD or QCD that nominally operates at the same temperature due to its close proximity on the chip, but which is not attenuated by absorption associated with trace chemicals in the sample gas. The extended waveguide 2414a that is exposed to the sample gas may be covered with a sorbent to enhance the concentration of trace chemicals of interest. In that case, the signal detected for the extended waveguide 2414a coated with the sorbent may be compared to the signal for a reference extended waveguide 2414b that is not coated with the sorbent.

In some embodiments, multi-spectral detection is obtained by positioning multiple in-plane interband or quantum cascade resonant cavity infrared detectors with different resonance wavelengths along a single multi-spectral detection waveguide.

Figure 25A:
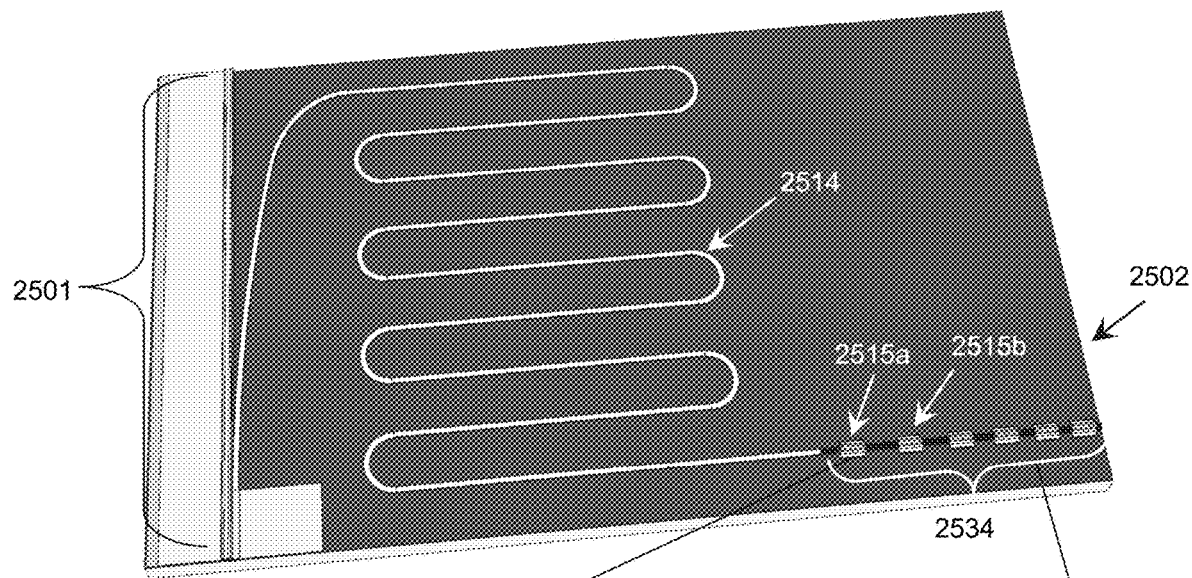
FIGS. 25A-25B are block schematics illustrating a further exemplary embodiment of a sensor apparatus in accordance with one or more aspects of the present disclosure, in which multi-spectral detection is obtained by positioning multiple in-plane interband or quantum cascade resonant cavity infrared detectors with different resonance wavelengths along a single multi-spectral detection waveguide.

FIG. 25A illustrates an embodiment of a chemical sensing PIC that integrates on the same III-V or silicon chip a highly stable laser cavity 2501, an extended passive waveguide 2514 whose top surface is exposed to a sample gas, and a series of multi-wavelength RCIDs 2515a/b/ . . . that are positioned in series along the same multi-spectral detection waveguide 2534, which receives the optical signal transmitted by the extended passive waveguide 2514. A DBR mirror 2519 is positioned on each side of each detector in the multi-spectral series of detectors, with each set of two such DBR mirrors that bound a given RCID is formed by etching gratings with a different pitch than the gratings that form the two DBRs that bound any other RCID in the series, so that each RCID in the series operates at a different resonance wavelength. Preferably, each RCID, consisting of the detector 2515 and DBR mirrors 2519, butt-couples to the next, with no space between the grating for one DBR with a given grating pitch and the grating for the next DBR with a different grating pitch.

In the case of an ICD RCID, it may be preferable to etch the grating into the passive waveguide structure, as illustrated in FIG. 8B, rather than into the full waveguide structure as illustrated in FIG. 8A. This is because optical loss due to absorption in the active quantum wells can degrade the quality factor of the RCID cavities if the DBRs are formed by etching the grating into the full active structure. The absorption loss in the active quantum wells is of less concern for a QCD RCID, particularly if the DBRs are ion bombarded to trap free carriers and further reduce the loss as discussed above.

Figure 25B:
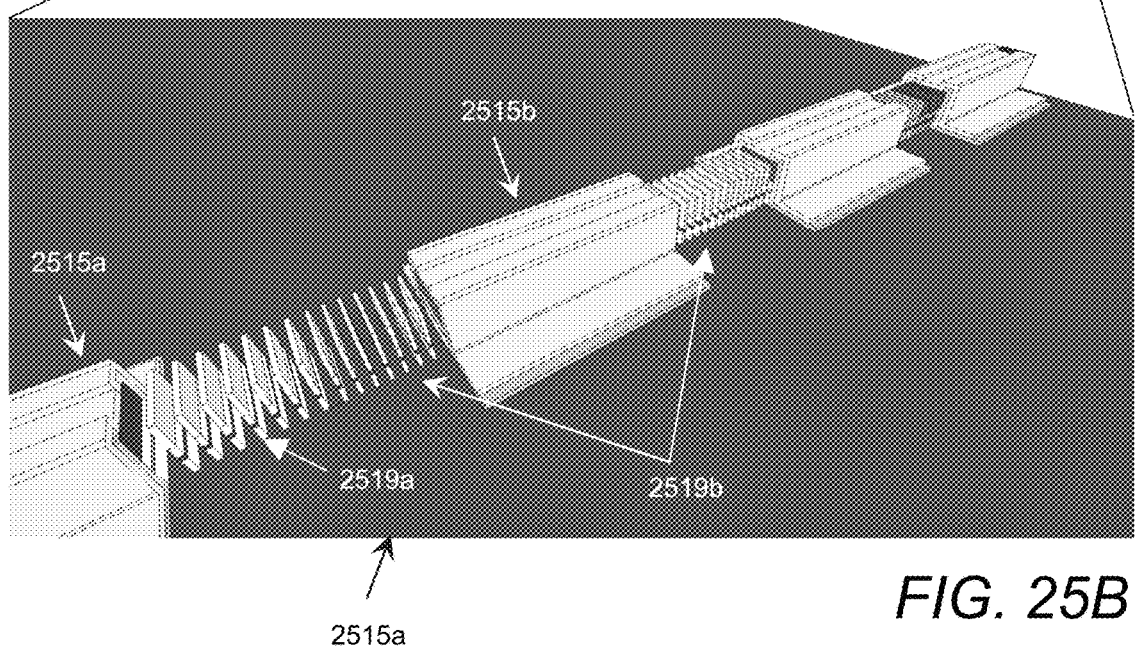

The photocurrent flowing in any given RCID is sensitive primarily to incoming light having a wavelength falling within one linewidth of the resonance wavelength of that RCID, whereas most of the incoming optical signal that does not fall within the narrow spectral linewidth of that RCID is transmitted to the next RCID, since the DBR mirrors do not provide high reflection of any non-resonance wavelength, and the longitudinal length L of the absorber in each RCID is short enough that only a small fraction of the beam is absorbed during a single pass through the absorber. However, most of the spectral component of the incoming optical signal that falls within the narrow spectral linewidth of the given RCID is absorbed, since the quality factor Q of the cavity defined by the two DBRs on each side of the RCID, in combination with the longitudinal pathlength L of the absorber for that RCID, provide high absorption quantum efficiency following multiple longitudinal passes of the selected spectral portion of the beam through the RCID. In some embodiments, such as that illustrated in FIG. 25, the multi-spectral detection waveguide 2534 terminates at an HR-coated facet 2502, or some other broadband mirror that provides a second pass of the optical signal through the multi-spectral series of RCIDs.

Each RCID in the series has a separate top contact that allows the photocurrent generated by the portion of the incoming signal falling within the selected spectral bandwidth of the given RCID to be measured. In some embodiments of a III-V PIC, the circuit is completed by a common ground contact to the substrate side of the chip, which also provides a common ground contact for all the interband or quantum cascade optical emitters on the chip. In the case of a silicon PIC, both contacts to the interband or quantum cascade RCID must be processed on the top side of the chip.

By tuning each RCID to a different resonance wavelength, via the grating pitch of the DBRs surrounding that RCID, the intensity of the incoming signal can be measured as a function of wavelength. Combining the information received from the different RCIDs in the multi-spectral series then provides a spectral characterization of the incoming signal. The spectral bandwidths of the different RCIDs in the multi-spectral series may be designed to nearly overlap, so that a continuous spectrum can be obtained, or the resonances for the different RCIDs may be selected to detect a pre-determined set of non-contiguous wavelengths of interest.

If the chemical sensing PIC employs an source with broad spectral bandwidth, such as an infrared light emitting diode (LED) such as the interband cascade LED (see C. S. Kim et al., *Opt. Engr.* 57, 011002 (2018), "Improved Mid-Infrared Interband Cascade Light Emitting Devices"), an infrared amplified spontaneous emission device (e.g., M. C. Zheng et al., Opt. Expr. 23, 2713, "High power spiral cavity quantum cascade superluminescent emitter"), or simply an ICL or QCL, the multi-spectral series of RCIDs can be used as the primary means for determining the spectrum for optical transmission through the extended passive waveguide 2514. This approach may sometimes be more straightforward to implement than the series of ring resonators that is employed to provide spectral information for the embodiment illustrated in FIG. 16. An advantage of employing a silicon PIC to implement the multi-spectral series of detectors is that DBRs with low loss and high Q may be more straightforward to process with high yield (Spott, *Photonics* 2016 supra) than is possible with DBRs processed on a III-V PIC.

More generally, the multi-spectral series of RCIDs may be used to provide multi-spectral detection of any signal propagating in an incoming passive waveguide. For example, it may be used for multi-spectral or hyper-spectral detection or imaging that on a PIC that does not integrate optical sources on the same chip.

Numerous variations on the inventive embodiments described above are possible. For example, FIGS. 3, 5, and 19 illustrate specific passive and active waveguide configurations that provide evanescent coupling of the beam propagating in the waveguide to an ambient sample gas. A variety of alternative designs for both the semiconductor layering design and the passive waveguide profile will be obvious to one skilled in the art. For example, starting with a QCL III-V epitaxial structure a passive waveguide may be constructed with a bottom InGaAs SCL as the core and the bottom InP cladding layer as the bottom clad of the passive waveguide. The InGaAs bottom SCL thickness should be designed for optimal operation of both the highly stable QCL and the passive waveguide. It was mentioned above that ion bombardment of the passive or active waveguide on a QCL chip may deplete the free electrons so as to further reduce the waveguide loss. QCL chips designed for LWIR operation can be used to expand the spectral coverage of III-V PICs incorporating QCLs and QCDs to on-chip chemical sensors probing wavelengths beyond 10 μm.

When the laser output is emitted from the chip (e.g., as in the embodiments illustrated in FIGS. 10 and 11), the advantageous enhanced stability that is realized when only a small fraction of the power is coupled out of the cavity per pass may be applied to diode lasers operating on any III-V substrate and emitting at any wavelength. This includes near-IR, visible, and ultraviolet diode lasers that may reside on InP, GaAs, GaN, or other III-V substrates, for which passive waveguides may be designed for compatibility with the given laser structure. While a similar enhancement of the laser stability may be induced by applying an HR coating to the output facet defining one end of the laser cavity, the invention's evanescently-coupled output from the side of the laser cavity provides simpler processing as well as much greater control over the out-coupling fraction per pass (via the double-waveguide profile, the spacer width between the two waveguides, and the distance over which the two waveguides propagate parallel to one another).

In some embodiments, both ends of the highly stable laser cavity are bounded by HR-coated facets that do not provide any significant spectral selectivity. The two mirrors at opposite ends of the laser cavity may be formed by two facets cleaved on opposite ends of a chip, as illustrated in FIG. 10, by two mirrors located on the same cleaved facet as illustrated in FIG. 11, or by etching an HR-coated facet to form at least one of the mirrors. In the embodiments of FIGS. 10 and 11, some fraction of the light is evanescently coupled to a second waveguide that is passive, although in other embodiments the second active waveguide may be active in order to minimize loss (if biased below the gain threshold) or provide further amplification of the optical signal (if biased above the gain threshold).

In other embodiments, a DBR mirror defines at least one end of the highly stable laser. Some fraction of the light can then couple into a passive or active output waveguide that emerges from the opposite end of the partially-reflecting DBR mirror, as illustrated in FIG. 8. Both out-coupling via evanescent coupling to a passive waveguide and out-coupling at a DBR mirror provide flexibility in the trade between laser stability and out-coupling efficiency. In the case of evanescent out-coupling to a second waveguide, the fraction of light in the laser cavity that is out-coupled per pass depends on the coupling strength between the two waveguides, which may be varied through adjustment of their separation distance and waveguide profiles. In the alternative case of out-coupling from a partially-reflecting DBR mirror that defines one end of the laser cavity, the etch depth and number of periods may be tuned to adjust the mirror reflectivity. It may be more straightforward to realize a broad range of out-coupling efficiencies when the DBR mirror approach is employed. In terms of positioning it is also more flexible to define the laser cavity by DBR mirrors, since the laser can then be placed anywhere within a PIC, whereas defining the cavity with one or more HR-coated cleaved facets requires that the laser be proximate to one or more boundaries of the chip.

In many embodiments, such as when stable output into a single spectral mode is desired, these two approaches to out-coupling may be used interchangeably. Which is preferable for use in a given PIC may depend in part on whether it is more straightforward to process a DBR or a double waveguide with separation close enough to provide substantial evanescent coupling. In the latter case, the laser cavity must also incorporate a DFB grating or other means of longitudinal mode selection if lasing in a single spectral mode is required. Which architecture is less challenging to fabricate with higher yield will depend in part on the material constituents, and also on the profiles and dimensions of the waveguides. However, in cases where lasing should not occur in a single spectral mode, e.g., when the laser is a frequency comb, a DBR mirror cannot be used to define either end of the laser cavity.

Figure 16:
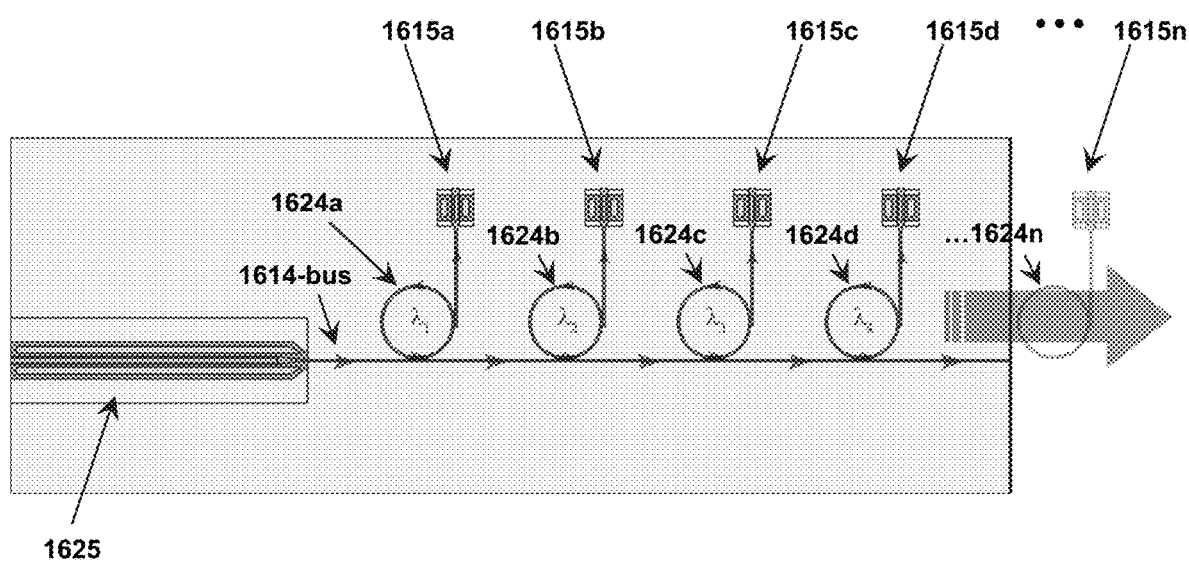
FIG. 16 is a block schematic illustrating another exemplary embodiment of a sensor apparatus in accordance with one or more aspects of the present disclosure.

In some embodiments, the laser source emits in a narrow spectral linewidth due to the implementation of a DFB grating. One or both ends of the cavity are then defined by DBR mirrors or some other means known to the art. In some embodiments, the narrow-linewidth emission wavelength may be tuned over some limited bandwidth by current, temperature, or some other means such as a sampled grating. The spectral bandwidth can be extended by disposing multiple laser sources on the same chip, which are coupled to multiple sensing regions, or by coupling a single laser source to multiple resonant cavities as illustrated in FIG. 16. Alternatively, the on-chip IR source may be a broadband emitter such as an LED or ASE source rather than a laser operating with a narrow spectral linewidth.

The sensing region may consist of an extended passive waveguide, or it may take the form of a ring or other high-Q resonator (or coupled pairs of such resonators) that substantially extend the effective path length for sensing.

The on-chip detector may be an ICD or QCD formed on the same III-V chip from the same epitaxial structure as the laser, or it may be formed from a different III-V, II-VI, or IV-VI active detector material bonded to the same silicon platform as the laser, or it may be an in-plane silicon bolometer processed as part of a silicon PIC. In the case of an ICD or QCD detector, the photocurrent may be collected at zero bias, at a reverse bias, or at a forward bias below the lasing threshold. The latter may be advantageous, for example, to minimize the loss induced by a detector integrated into the laser cavity as illustrated in FIG. 6. The absorber region of the detector may be placed within a resonant cavity for operation as a resonant cavity infrared detector by processing DBR mirrors at both ends of the absorber region.

By combining these options for the MWIR optical source, the sensing region, and the detector, the spectral dependence of the absorption by the sample gas may be determined by tuning the resonance wavelength of the source, the sensing region if it incorporates a resonant cavity, or the detector. If more than one of these operates in a narrow spectral band, the resonance wavelengths must be matched by careful design and calibration, independent temperature tuning of the different regions, or some other means. Spectral information may also be obtained by combining multiple sensors on the same chip, with each operating at a different wavelength.

Many of the embodiments disclosed above apply equally to PICs integrated on either a III-V or silicon substrate, while others are only advantageous when applied to III-V PICs.

Some aspects of the invention may be advantageous even if an entire chemical sensing system is not integrated on the same III-V or silicon chip. For example, one or more highly stable laser sources and passive sensing waveguides in accordance with the invention may be combined on a III-V or silicon chip, in conjunction with coupling into one or more detectors that reside off the chip. Or similarly, one or more off-chip optical sources may be used in conjunction with one or more passive waveguide sensing areas and one or more infrared detectors residing on the chip.

While the descriptions of the invention as applied to MWIR and LWIR PICs have assumed laser sources based on either type-II GaSb-based ICL structures or InP-based QCL structures, the invention applies equally to other cascade laser structures. These include type-I ICLs that may similarly function as ICDs when operated at zero bias, ICLs grown on InAs substrates, and QCLs grown on GaAs, InAs, GaSb, GaN, or silicon substrates. See, e.g., L. Shterengas et al., "Type-I Quantum Well Cascade Diode Lasers Emitting Near 3 µm," *Appl. Phys. Lett.* 103, 121108 (2013).

The in-plane waveguides in which the optical signals propagate may be formed entirely within the III-V semiconductor from which the active detector layers are formed, or by depositing or bonding to some other material to form the core and/or clad for a waveguide. For example, chalcogenide materials may be deposited and patterned to form waveguides within a III-V or silicon PIC.

ADVANTAGES AND NEW FEATURES

A III-V or Si PIC designed for chemical sensing that is based on any of the embodiments described in this invention will be suitable for mass production of hundreds of chemical sensors on the same chip. The individual sensors can then be singulated to form the basis for a package that is both extremely compact and inexpensive.

A primary advantage of most of the disclosed embodiments is the high stability of the laser source or multiple laser sources used therein, which is accomplished by isolating the laser(s) to the maximum degree possible from any interactions with optical elements external to the laser cavity or with other optical elements in a PIC. Rather than coupling a substantial fraction of the laser power out of the cavity or elsewhere on the chip at some point during each pass through the cavity, the cavity is formed by two HR mirrors that are independent of the light extraction so that only a small, adjustable fraction of the power is extracted during each pass through the cavity via evanescent coupling to a passive waveguide. While the maximum output power and power conversion efficiency may in some cases be reduced somewhat, the threshold current and threshold drive power are minimized by the substantial reduction of loss at the output mirror, as well as by the potential for reducing the cavity length (e.g., to <<1 mm) if the mirror loss can be minimized. The laser's increased stability and reduced drive power may be exploited in configurations that emit the beam from the chip for use in an external system, or as an optical source component of a PIC.

The invention also provides a framework for constructing fully integrated photonic integrated circuits, and especially for creating III-V PICs on the native substrates of interband and quantum cascade laser structures. A III-V PIC designed in accordance with the invention will be much simpler and less expensive to process with high yield than a Si-based PIC that integrates multiple III-V active components. The numerous optical elements that may be incorporated into a single III-V PIC include lasers, detectors, passive waveguides, sensing waveguides that evanescently couple to an ambient sample gas, and arrayed waveguide gratings (AWGs) for spectral beam combining and separating.

The present invention can be utilized for any one or more of these configurations. For example, the invention may be used to construct an ultra-compact chemical sensing system that combines one or more ICL or QCL sources, one or more ICDs or QCDs, passive sensing waveguides, and passive connecting waveguides, all on the same III-V chip. In some embodiments, the invention can provide a chemical sensing system based on dual-comb spectroscopy that employs two highly stable ICL frequency combs integrated on the same chip with a passive sensing waveguide and ICD. PICs incorporating various ICL/ICD and QCL/QCD designs can provide on-chip chemical sensors designed for highly stable room-temperature cw operation at wavelengths from <2.5 μm to >11 μm. In fact, it should be possible to extend this range to longer wavelengths, since a QCL emitting at a given wavelength may be expected to operate to a somewhat higher temperature when both ends of the laser cavity are defined by HR mirrors, as in many embodiments of the invention, than for a conventional design having an HR mirror at only one end of the cavity.

Although the present disclosure describes and illustrates various specific embodiments, aspects, and features, one skilled in the art would readily appreciate that the invention described herein is not limited to only the described embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A highly stable semiconductor laser, comprising: a laser cavity comprising a first end and a second end, the first end terminating at a highly-reflective facet coated with a dielectric spacer and a highly reflective metal, and the second end terminating at a different position on the same facet that is coated with the same dielectric spacer and the same highly reflective metal, the laser cavity further comprising an active narrow-ridge waveguide situated within the laser cavity; wherein the highly reflective metal coating the facet prevents laser light produced in the active narrow-ridge waveguide from being passed from the first and second ends of the laser cavity and being fed back into the laser cavity following interactions of the laser light with external optical elements; wherein curving portions of the laser cavity allow both ends to terminate at different positions on the same highly-reflective facet; the laser further including a passive waveguide situated within the laser cavity and that runs parallel to a predefined portion of the active narrow-ridge waveguide; wherein a predetermined fraction of light from the active narrow-ridge waveguide is tunably passed to the passive waveguide via evanescent coupling, the evanescent coupling to the passive waveguide providing a single pathway for coupling light into or out of the laser cavity to an optical element outside the laser cavity; and wherein an extent of the evanescent coupling between the active narrow-ridge waveguide and the passive waveguide and corresponding output from the laser cavity is tuned by tuning a distance between the active narrow-ridge waveguide and passive waveguide or by tuning a length of the laser cavity over which the active narrow-ridge waveguide and passive waveguide run in parallel.

2. The highly stable semiconductor laser according to claim 1, wherein the laser is an interband cascade laser (ICL), the active narrow-ridge waveguide being formed from an ICL wafer material that includes:
   an $n^+$-GaSb substrate;
   an n-InAs/Al Sb superlattice bottom clad on an upper surface of the substrate;
   a bottom GaSb separate confinement layer (SCL) on an upper surface of the bottom clad;
   at least one active gain stage on an upper surface of the bottom GaSb SCL;
   an n-InAs/AlSb superlattice top clad on an upper surface of the active gain stage; and
   an $n^+$-InAs or $n^+$-InAsSb top contact layer on an upper surface of the top clad;
   the active narrow-ridge waveguide further including sidewalls of the narrow ridge etched to a depth below the at least one active stage of the first ICL wafer and further including a dielectric layer deposited on the sidewalls of the ridge and a metallization layer deposited on the upper surface of the ridge to provide a top electrical contact;
   wherein the $n^+$-InAs or $n^+$-InAsSb top contact layer, the n-InAs/AlSb superlattice top clad layer, and the active gain stages of a second ICL wafer material adjacent to the active narrow-ridge waveguide are etched away to form the passive waveguide that runs parallel to a predefined portion of the active narrow-ridge waveguide, with the etch stopping near the top of the bottom GaSb SCL so as to leave an $n^+$-GaSb substrate, an n-InAs/AlSb superlattice bottom clad, and some or all of the bottom GaSb separate confinement layer; and wherein the passive waveguide further comprises a ridge formed by etching the sidewalls of the passive waveguide to a depth stopping near the top of the n-InAs/AlSb superlattice bottom clad or near the bottom of the bottom GaSb SCL.

* * * * *